United States Patent
Nam et al.

(10) Patent No.: US 9,893,077 B2
(45) Date of Patent: Feb. 13, 2018

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Phil Ouk Nam, Suwon-si (KR); Yong Hoon Son, Yongin-si (KR); Kyung Hyun Kim, Seoul (KR); Byeong Ju Kim, Hwaseong-si (KR); Kwang Chul Park, Suwon-si (KR); Yeon Sil Sohn, Yongin-si (KR); Jin I Lee, Hwaseong-si (KR); Jong Heun Lim, Hwaseong-si (KR); Won Bong Jung, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/049,160

(22) Filed: Feb. 22, 2016

(65) Prior Publication Data

US 2016/0358927 A1 Dec. 8, 2016

(30) Foreign Application Priority Data

Jun. 5, 2015 (KR) ........................ 10-2015-0080004

(51) Int. Cl.
| | |
|---|---|
| H01L 21/00 | (2006.01) |
| H01L 21/84 | (2006.01) |
| H01L 21/20 | (2006.01) |
| H01L 21/36 | (2006.01) |
| H01L 29/10 | (2006.01) |
| H01L 29/76 | (2006.01) |
| H01L 31/036 | (2006.01) |
| H01L 31/112 | (2006.01) |

(Continued)

(52) U.S. Cl.
CPC .... *H01L 27/1157* (2013.01); *H01L 21/02667* (2013.01); *H01L 21/02675* (2013.01); *H01L 27/11573* (2013.01); *H01L 27/11582* (2013.01)

(58) Field of Classification Search
CPC ............ H01L 21/8221; H01L 27/1157; H01L 27/11563; H01L 27/11568; H01L 27/11573; H01L 27/11578; H01L 27/11582; H01L 27/11517; H01L 27/11521; H01L 27/11526; H01L 27/11551; H01L 27/11556; H01L 27/115
USPC ............ 257/314, 66, 67, E27.026, E21.614; 438/152, 166, 479, 486
See application file for complete search history.

(56) References Cited

U.S. PATENT DOCUMENTS

| | | |
|---|---|---|
| 6,555,449 B1 | 4/2003 | Im et al. |
| 6,867,074 B2 | 3/2005 | Tsao |

(Continued)

*Primary Examiner* — Fernando L Toledo
*Assistant Examiner* — Aaron Gray
(74) *Attorney, Agent, or Firm* — Lee & Morse, P.C.

(57) ABSTRACT

A memory device, including a first memory region including a first substrate, a plurality of first semiconductor devices on the first substrate, and a first interlayer insulating layer covering the plurality of first semiconductor devices; and a second memory region including a second substrate on the first interlayer insulating layer and a plurality of second semiconductor devices on the second substrate, the second substrate including a first region in a plurality of grooves in the first interlayer insulating layer and a second region including grains extending from the first region, the second region being on an upper surface of the first interlayer insulating layer.

12 Claims, 42 Drawing Sheets

(51) Int. Cl.
  *H01L 27/1157* (2017.01)
  *H01L 21/02* (2006.01)
  *H01L 27/11573* (2017.01)
  *H01L 27/11582* (2017.01)

(56) References Cited

U.S. PATENT DOCUMENTS

| | | |
|---|---|---|
| 7,045,469 B2 | 5/2006 | Sohn et al. |
| 7,115,455 B2 | 10/2006 | Chang |
| 7,195,992 B2 | 3/2007 | Gu et al. |
| 7,910,432 B2 | 3/2011 | Tanaka et al. |
| 8,507,918 B2 | 8/2013 | Son et al. |
| 8,619,453 B2 | 12/2013 | Scheuerlein |
| 8,634,242 B2 | 1/2014 | Grossi et al. |
| 2009/0104759 A1* | 4/2009 | Kang ............... H01L 21/02532 438/487 |
| 2011/0186851 A1 | 8/2011 | Son et al. |
| 2015/0263044 A1* | 9/2015 | Yamasaki ........... H01L 21/0217 257/67 |
| 2016/0056171 A1* | 2/2016 | Manorotkul ...... H01L 27/11526 257/66 |

* cited by examiner

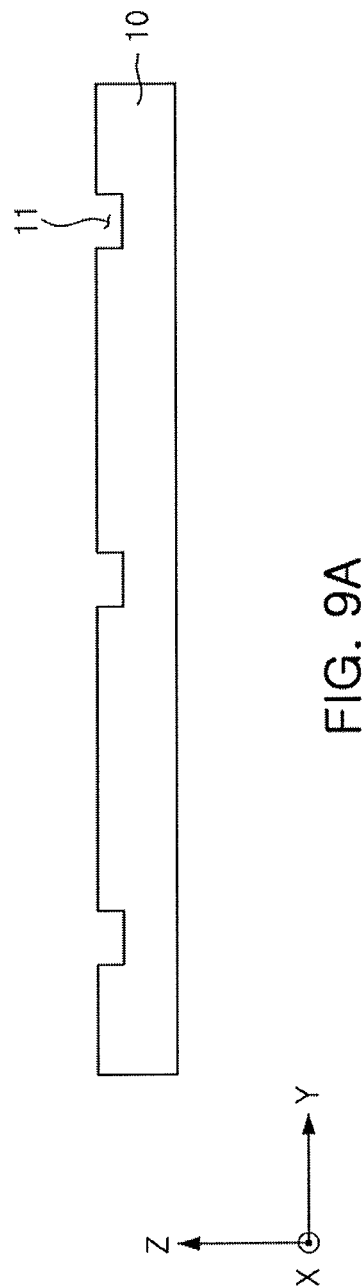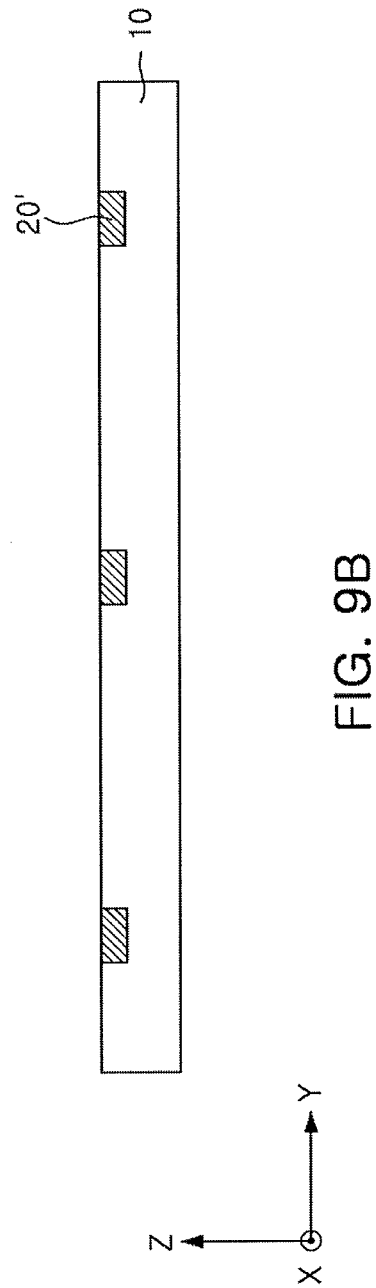

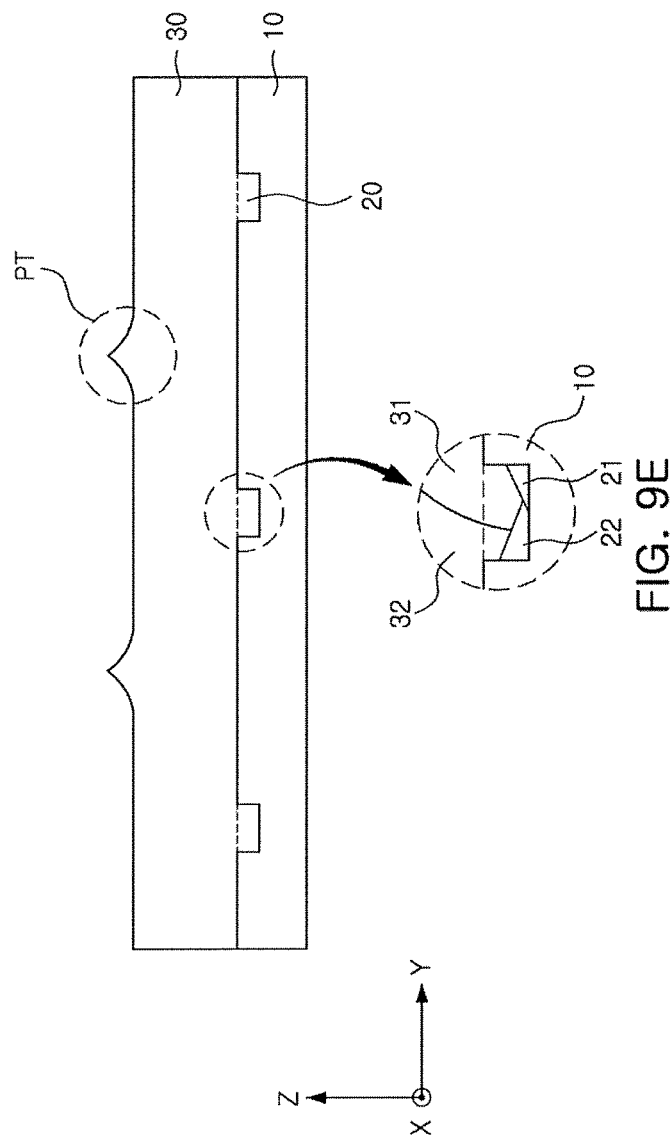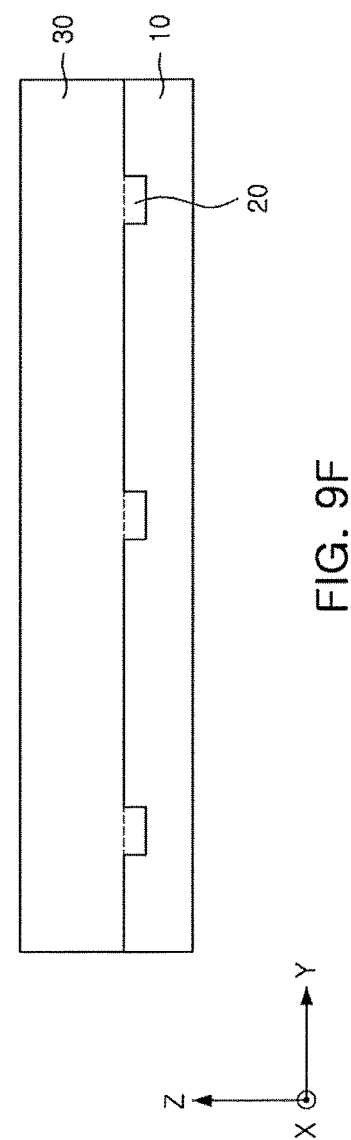

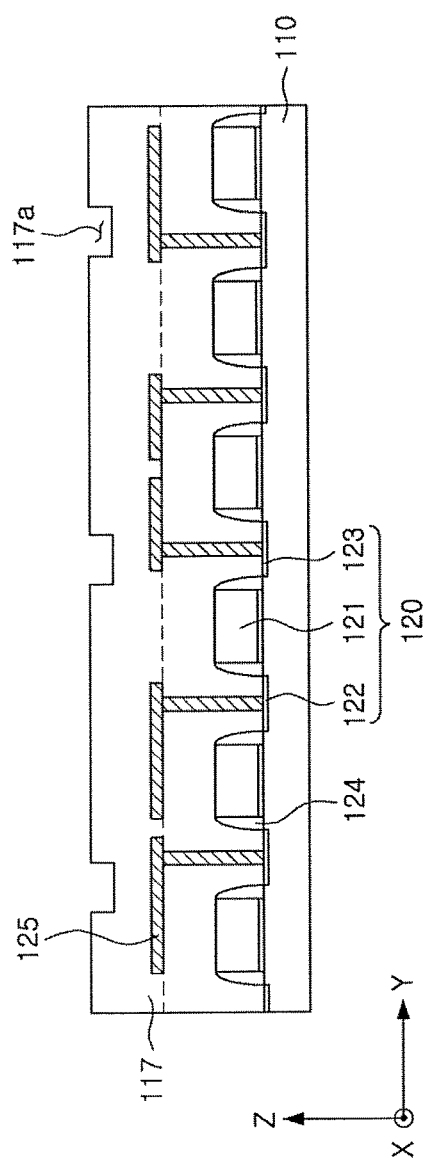
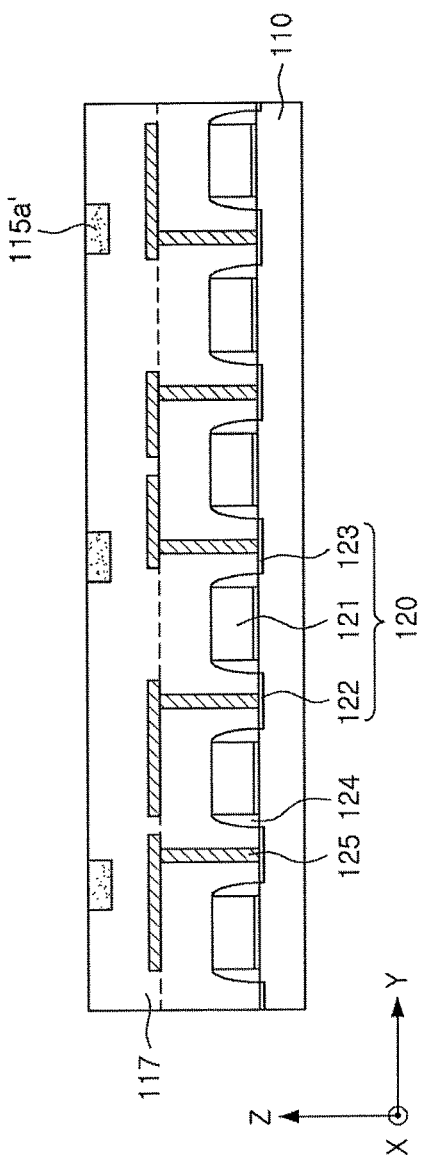
FIG. 10C
FIG. 10D

MEMORY DEVICE AND METHOD OF MANUFACTURING THE SAME

CROSS-REFERENCE TO RELATED APPLICATION

Korean Patent Application No. 10-2015-0080004, filed on Jun. 5, 2015, in the Korean Intellectual Property Office, and entitled: "Memory Device and Method of Manufacturing the Same," is incorporated by reference herein in its entirety.

BACKGROUND

1. Field

Embodiments relate to a memory device and a method of manufacturing the memory device.

2. Description of the Related Art

Electronic products may be gradually reduced in overall size, while requiring the ability to process high capacity data. Accordingly, it may be necessary to increase the degree of integration of semiconductor devices used in such electronic products.

SUMMARY

Embodiments may be realized by providing a memory device, including a first memory region including a first substrate, a plurality of first semiconductor devices on the first substrate, and a first interlayer insulating layer covering the plurality of first semiconductor devices; and a second memory region including a second substrate on the first interlayer insulating layer and a plurality of second semiconductor devices on the second substrate, the second substrate including a first region in a plurality of grooves in the first interlayer insulating layer and a second region including grains extending from the first region, the second region being on an upper surface of the first interlayer insulating layer.

The first region may include a plurality of first regions, and each of the plurality of first regions may extend in a first direction in the first interlayer insulating layer.

The second memory region may include a channel area extending in a direction perpendicular to an upper surface of the second substrate, and the plurality of second semiconductor devices may include a plurality of gate electrode layers stacked on the second substrate to be adjacent to the channel area.

The second memory region may include at least one word-line cut extending in the direction perpendicular to the upper surface of the second substrate, the at least one word-line cut being between the plurality of first regions, and at least one word-line cut dividing the plurality of gate electrode layers into a plurality of unit blocks.

The at least one word-line cut may extend in the first direction.

The memory device may further include an epitaxial layer between the second region and the channel area, the epitaxial layer electrically connecting the second region to the channel area.

The second region may include polysilicon, and the first region may be a seed area for forming the second region.

The first substrate may be a single crystalline silicon substrate, and the second substrate may be a polysilicon substrate.

An upper surface of the first region may be coplanar with the upper surface of the first interlayer insulating layer.

Embodiments may be realized by providing a method of manufacturing a memory device, the method including providing a first memory region including a first substrate, a plurality of first semiconductor devices on the first substrate, and a first interlayer insulating layer covering the plurality of first semiconductor devices; forming a plurality of grooves by removing a portion of an upper surface of the first interlayer insulating layer; forming a plurality of first regions including polysilicon in the plurality of grooves; forming an amorphous silicon layer on the plurality of first regions; forming a second region including polysilicon from the plurality of first regions by crystallizing the amorphous silicon layer; and providing a second memory region by forming a plurality of second semiconductor devices on the second region.

Forming the plurality of first regions may include filling the plurality of grooves with amorphous silicon; and laser-annealing the amorphous silicon.

Forming the second region may include melting the amorphous silicon layer; and crystallizing the melted amorphous silicon layer using the plurality of first regions as seed layers.

Forming the second region may include crystallizing the melted amorphous silicon layer using a sequential lateral solidification process.

Forming the second region may include planarizing an upper surface of the second region.

Providing the second memory region may include forming a channel area extending in a direction perpendicular to an upper surface of the second region; forming a plurality of gate electrode layers stacked on the second region, the plurality of gate electrode layers being adjacent to the channel area; and forming at least one word-line cut extending in the direction perpendicular to the upper surface of the second region, the at least one word-line cut being between the plurality of first regions, the at least one word-line cut dividing the plurality of gate electrode layers into a plurality of unit blocks.

Embodiments may be realized by providing a method of manufacturing a device, the device including a first layer on a second layer, the method including forming grooves on an interlayer dielectric layer of the second layer; forming first regions including polysilicon in the grooves; forming a second region by depositing an amorphous silicon layer on the first regions; melting the amorphous silicon layer to form a melted amorphous silicon layer; and crystallizing the melted amorphous silicon layer using the first regions as a seed layer, the second region including lateral grains crystallized from the first regions, grain boundaries existing between the lateral grains in the second region, the grain boundaries being between the first regions.

A protrusion may be formed between the first regions due to the grain boundaries between the first regions. The method may further include removing the protrusion using a polishing process; and planarizing an upper surface of the second region.

The method may further include forming a plurality of second semiconductor devices on the second region, forming the plurality of second semiconductor devices on the second region including forming a word-line cut between the first regions.

Forming the word-line cut between the first regions may include forming the word-line cut on the grain boundaries between the first regions.

Forming the word-line cut on the grain boundaries between the first regions may include forming multiple word-line cuts on respective grain boundaries between the first regions; and the first regions may exist between every pair of adjacent word-line cuts.

BRIEF DESCRIPTION OF THE DRAWINGS

Features will become apparent to those of skill in the art by describing in detail exemplary embodiments with reference to the attached drawings in which:

FIGS. 9A to 9F illustrate diagrams of a method of manufacturing a substrate according to an exemplary embodiment;

DETAILED DESCRIPTION

Figure 1:
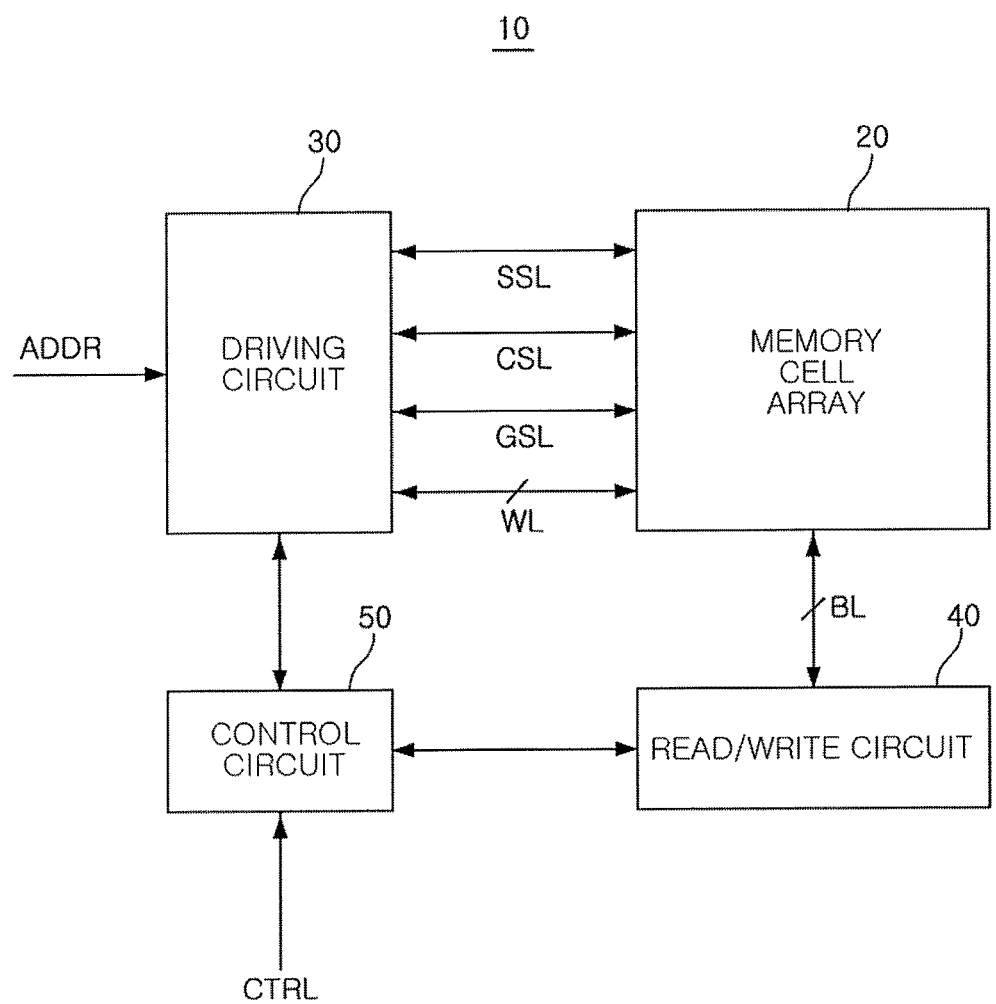
FIG. 1 illustrates a schematic block diagram of a memory device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the shapes and dimensions of elements may be exaggerated for clarity, and the same reference numerals will be used throughout to designate the same or like elements. It will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates a schematic block diagram of a memory device according to an exemplary embodiment.

Referring to FIG. 1, a memory device 10 according to an exemplary embodiment may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 via, for example, a word line WL, a common source line CSL, a string select line SSL, and a ground select line GSL, and to the read/write circuit 40 via a bit line BL. In some exemplary embodiments, the plurality of memory cells arranged in the same row may be connected to the same word line WL, and the plurality of memory cells arranged in the same column may be connected to the same bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In some exemplary embodiments, the driving circuit 30 may receive address information ADDR from an external source and decode the received address information ADDR to select at least a portion of the word lines WL, the common source line CSL, the string select lines SSL, and the ground select lines GSL connected to the memory cell array. The driving circuit 30 may include a circuit for driving each of the word lines WL, the string select lines SSL, and the common source line CSL.

The read/write circuit 40 may select at least a portion of the bit lines BL connected to the memory cell array 20 according to a command received from the control circuit 50. The read/write circuit 40 may read data stored in a memory cell connected to the selected portion of the bit lines BL, or write data to the memory cell connected to the selected portion of the bit lines BL. The read/write circuit 40 may include circuits, such as, for example, a page buffer circuit, an input/output buffer circuit, and a data latch circuit, in order to perform the above-described operations.

The control circuit 50 may control operations of the driving circuit 30 and the read/write circuit 40 in response to a control signal CTRL transmitted from an external source. When data stored in the memory cell array 20 is read, the control circuit 50 may control an operation of the driving circuit 30 so as to supply a voltage to the word line WL in which data to be read is stored for a reading operation. When the voltage for a reading operation is supplied to a specific word line WL, the control circuit 50 may control the read/write circuit 40 to read data stored in a memory cell connected to the word line WL to which the voltage for a reading operation is supplied.

When data is to be written in the memory cell array 20, the control circuit 50 may control an operation of the driving circuit 30 so as to supply a voltage to a word line WL to which data is to be written in the writing operation. When the voltage for the writing operation is supplied to a specific word line WL, the control circuit 50 may control the read/write circuit 40 to write data to a memory cell connected to the word line WL to which the voltage for the writing operation is supplied.

Figure 2A:
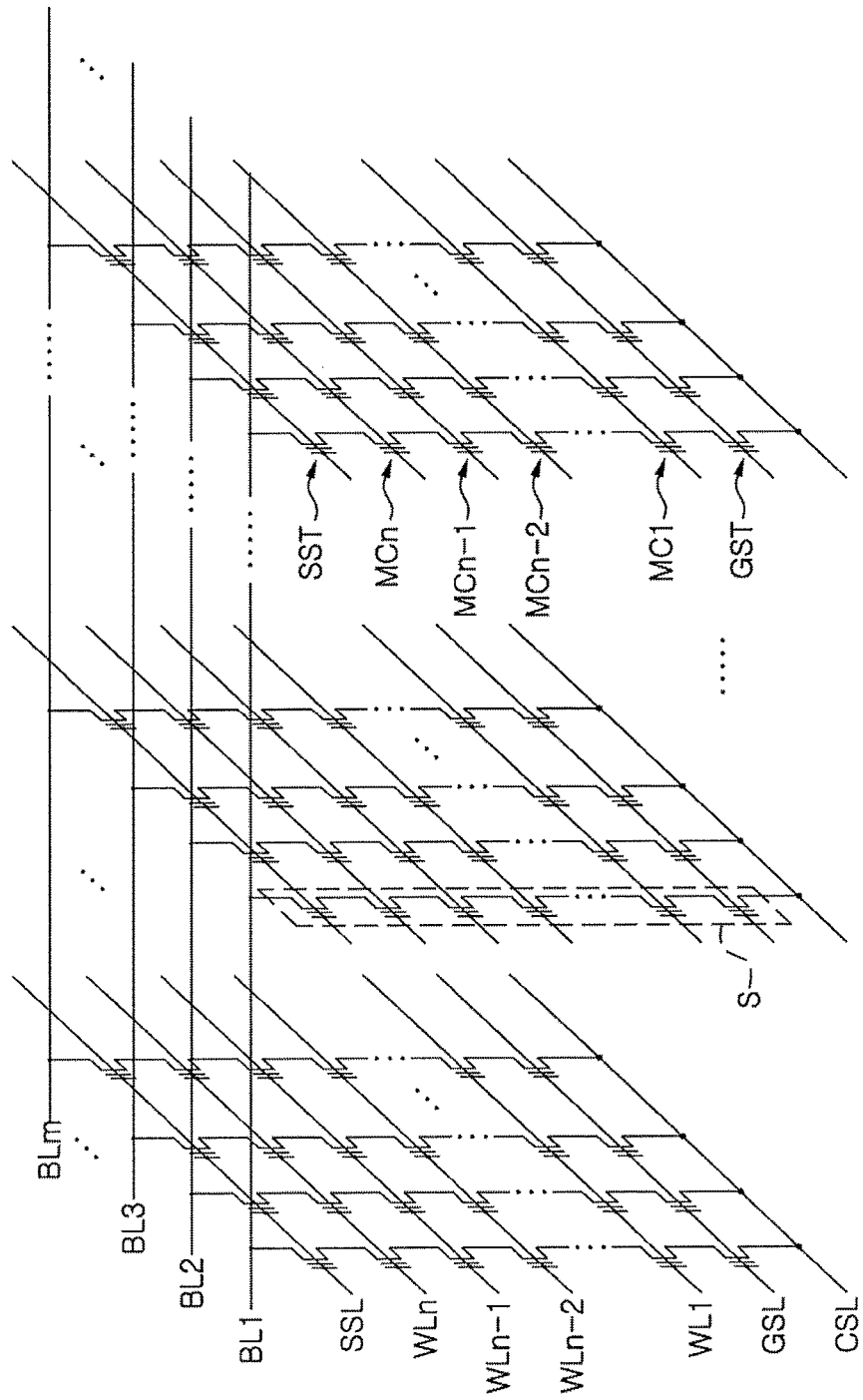
FIGS. 2A to 2C illustrate circuit diagrams of a memory cell array included in a memory device according to an exemplary embodiment.
Figure 2B:
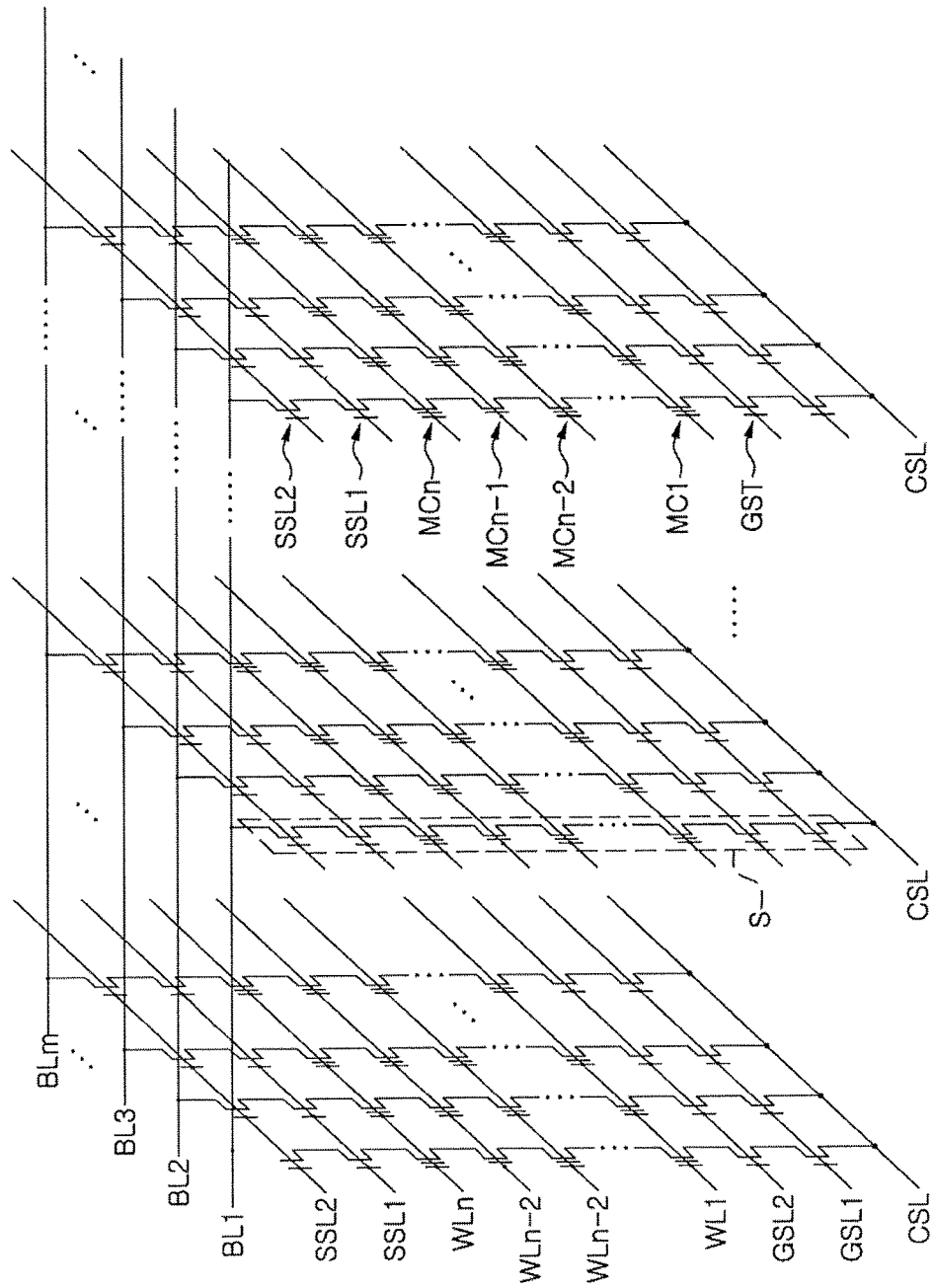
Figure 2C:
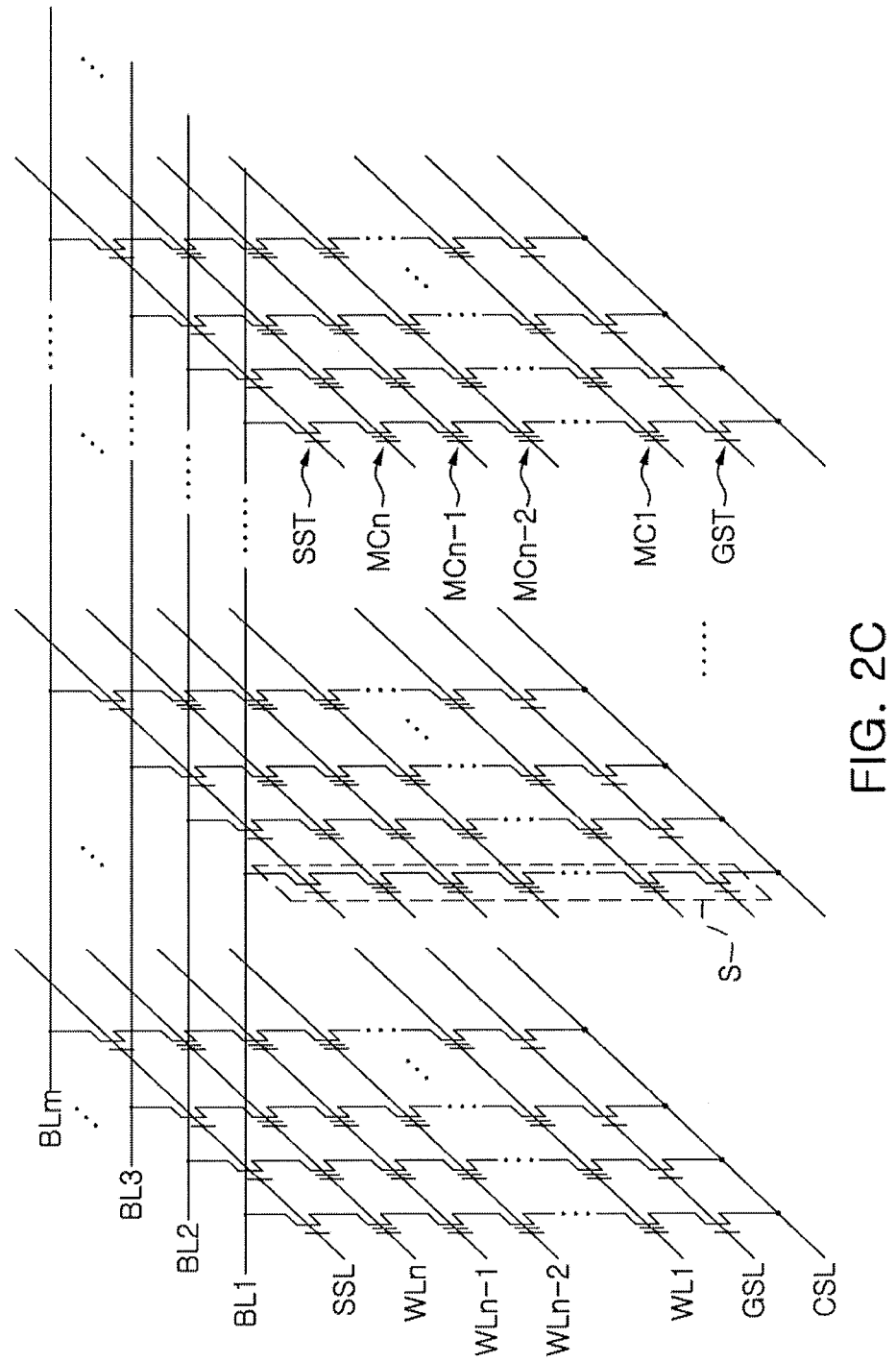

FIGS. 2A to 2C illustrate equivalent circuit diagrams of memory cell arrays of memory devices in accordance with embodiments.

First, referring to FIG. 2A, a memory cell array according to an exemplary embodiment may include a plurality of memory cell strings S. Each of the memory cell strings S may include n memory cell devices MC1 to MCn connected to each other in series, and a ground select transistor GST and a string select transistor SST respectively connected to both ends of the memory cell devices MC1 to MCn in series.

The n memory cell devices MC1 to MCn connected to each other in series may be respectively connected to word lines WL1 to WLn for selecting at least a portion of the memory cell devices MC1 to MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of a memory cell device MCn. In FIG. 2A, one ground select transistor GST and one string select transistor SST are connected to the n memory cell devices MC1 to MCn connected to each other in series. In embodiments, a plurality of ground select transistors GST or a plurality of string select transistors SST may be connected to the n memory cell devices MC1 to MCn, or the ground select transistor GST or the string select transistor SST may have different structures from the n memory cell devices MC1 to MCn.

For example, referring to an equivalent circuit diagram of a memory cell array illustrated in FIG. 2B, a plurality of ground select transistors GST1 and GST2 and a plurality of string select transistors SST1 and SST2 may be included in a single memory cell string S. Referring to FIG. 2C, a ground select transistor GST and a string select transistor SST may not include a floating gate, differently to, e.g., different from, the memory cell devices MC1 to MCn.

A drain terminal of the string select transistor SST may be connected to a plurality of bit lines BL1 to BLm. When a signal is applied to the gate terminal of the string select transistor SST via the string select line SSL, the signal applied via the bit lines BL1 to BLm may be transmitted to the n memory cell devices MC1 to MCn connected to each other in series, and a data reading or data writing operation may be performed. When the source terminal applies a signal to the gate terminal of the ground select transistor GST connected to the common source line CSL via the ground select line GSL, an erase operation in which charges stored in the n memory cell devices MC1 to MCn are fully removed may be performed.

Figure 3:
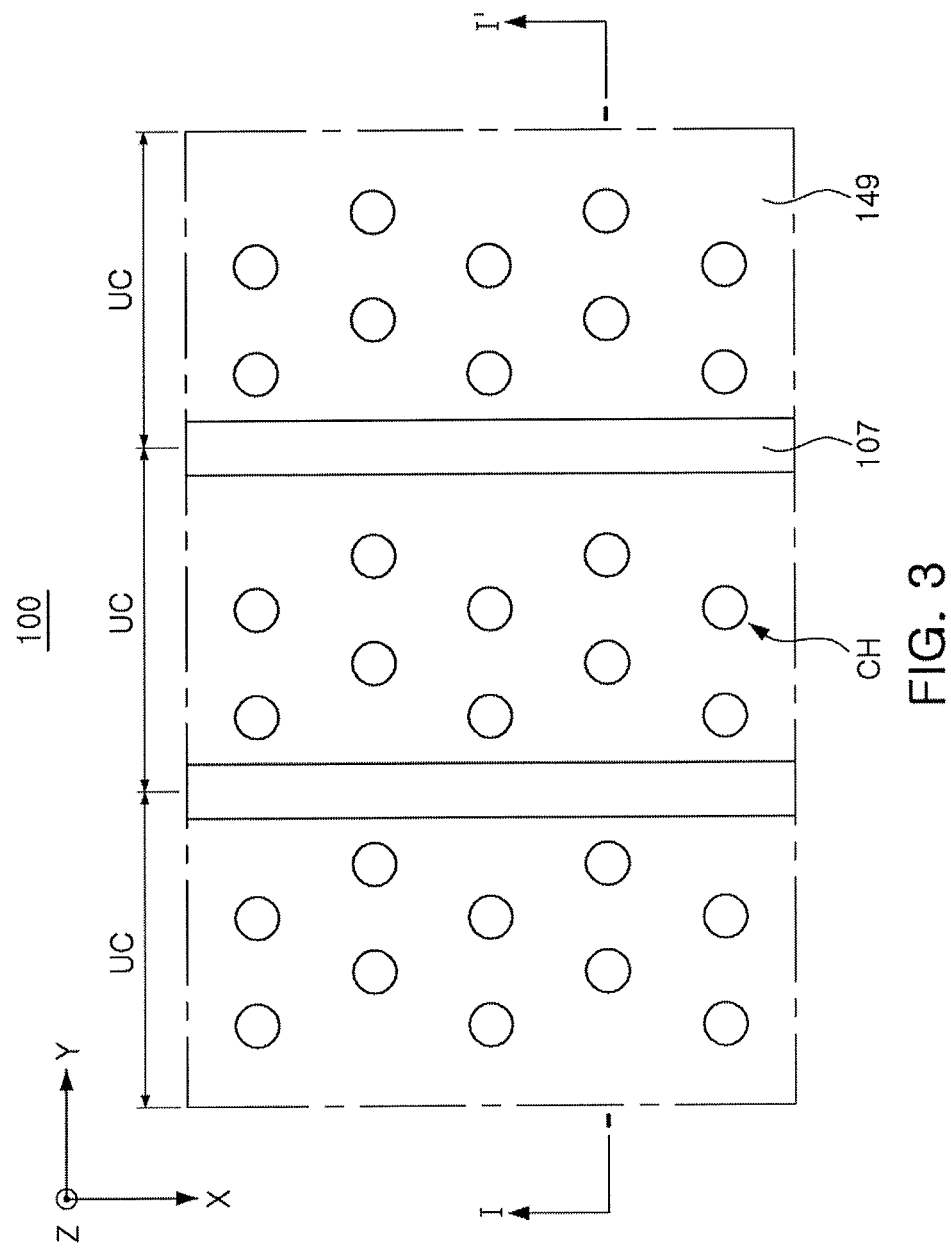
FIG. 3 illustrates a schematic plan view of a memory device according to an exemplary embodiment.

FIG. 3 illustrates a schematic plan view of a memory device according to an exemplary embodiment.

Referring to FIG. 3, a schematic plan view illustrates some components included in a memory device 100 according to an exemplary embodiment. The memory device 100 may include a plurality of word-line cuts 107 dividing a memory cell region into a plurality of unit cell regions UC, and a plurality of channel areas CH disposed in each unit cell region UC.

Each of the plurality of channel areas CH may extend in a direction perpendicular to an x-y plane, and a plurality of gate electrode layers may be stacked in the direction perpendicular to the x-y plane to be adjacent to the channel areas CH. The plurality of word-line cuts 107 may define the plurality of unit cell regions UC by dividing the plurality of gate electrode layers stacked adjacently to the channel areas CH, and extend in a first direction, for example, in an x-axis direction illustrated in FIG. 3.

The plurality of gate electrode layers stacked adjacently to the channel areas CH may be connected to circuit devices in a peripheral circuit region disposed below or above the plurality of unit cell regions UC. The plurality of channel areas CH may pass through the plurality of gate electrode layers and may be arranged side by side in the x-axis direction in one unit cell region UC, and arranged in zigzag patterns in a y-axis direction. For example, the channel areas CH in columns adjacently to each other may be shifted to be staggered. In the memory device 100, a memory cell string may be configured around each of the channel areas CH. In embodiments, the arrangement of the channel areas CH may be variously modified according to exemplary embodiments, and the number of the channel areas CH arranged in a direction may not be limited to that illustrated in FIG. 3.

FIGS. 4 to 7 illustrate structures of memory devices according to exemplary embodiments.

Figure 4:
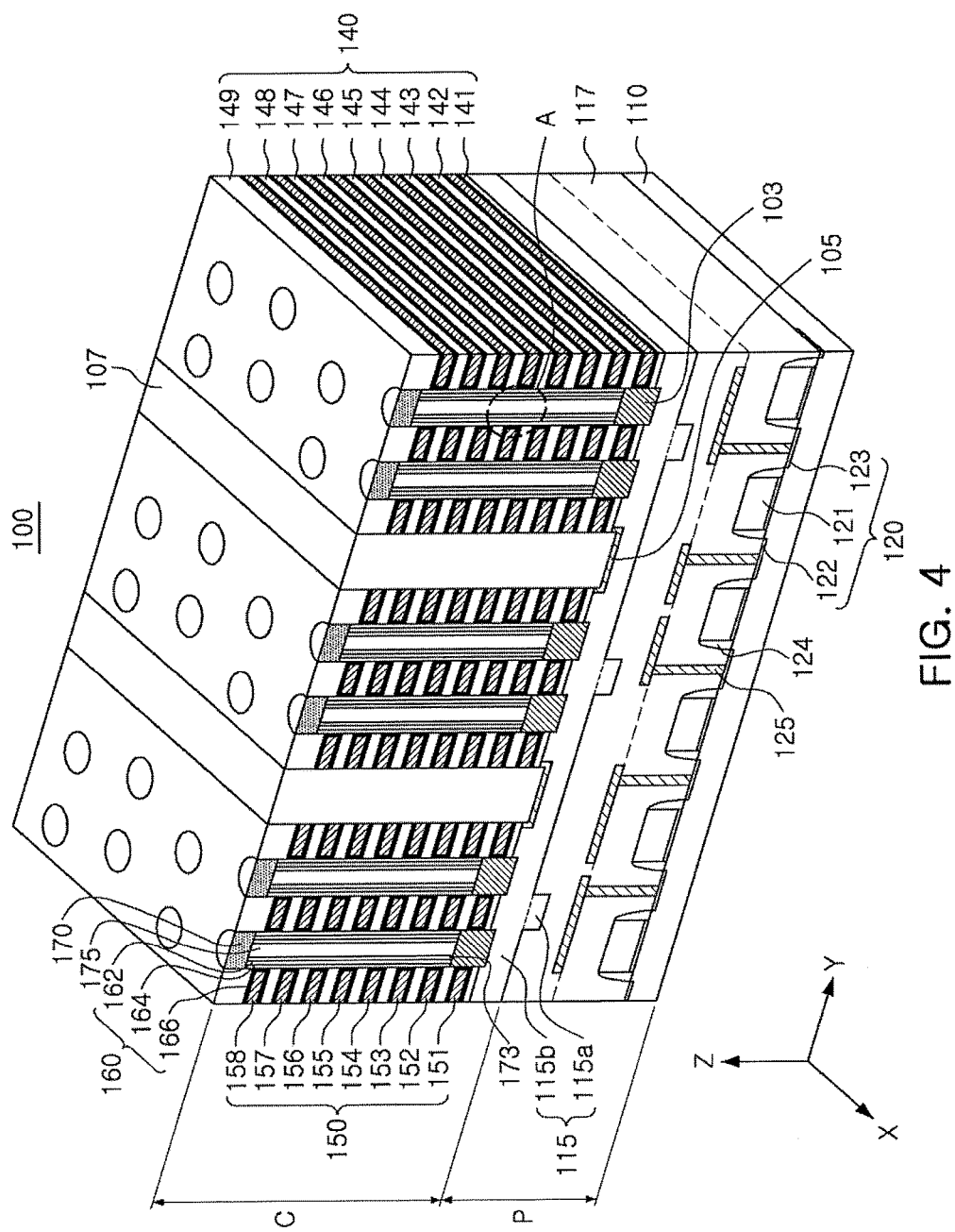
FIGS. 4 to 7 illustrate diagrams of memory devices according to exemplary embodiments.

FIG. 4 illustrates a perspective view of a memory device 100 according to an exemplary embodiment. In some exemplary embodiments, the memory device 100 illustrated in FIG. 4 may be a part taken along line I-I' in the memory device 100 illustrated in FIG. 3.

Referring to FIG. 4, the memory device 100 may include a plurality of memory regions arranged vertically, as different regions. In some exemplary embodiments, a first memory region disposed in a low position may be a peripheral circuit region P, and a second memory region disposed in a high position may be a cell region C. The memory regions may include substrates 110 and 115, different from each other.

For example, the peripheral circuit region P and the cell region C may include a first substrate 110 and a second substrate 115, respectively. The peripheral circuit region P may include a plurality of first semiconductor devices 120 disposed on the first substrate 110 and a first interlayer insulating layer 117 covering the plurality of first semiconductor devices 120. The plurality of first semiconductor devices 120 included in the peripheral circuit region P may be provided as a plurality of circuit devices.

The second substrate 115 included in the cell region C may be disposed on the first interlayer insulating layer 117. For example, the memory device 100 according to the exemplary embodiment illustrated in FIG. 4 may have a cell-on-peripheral (COP) structure in which the cell region C is disposed on the peripheral circuit region P. In exemplary embodiments, the memory device 100 may have a peripheral-on-cell (POC) structure in which the cell region C is disposed below the peripheral circuit region P.

The cell region C may include a plurality of gate electrode layers 150 (including layers 151 to 158) disposed on the second substrate 115, a plurality of insulating layers 140 (including layers 141 to 149) disposed between the plurality of gate electrode layers 150, and channel areas 173. The plurality of gate electrode layers 150 and the plurality of insulating layers 140 may be alternately stacked on the second substrate 115 to be adjacent to outer sides of the channel areas 173. A gate insulating layer 160 may be disposed between the plurality of gate electrode layers 150 and the channel areas 173. In some exemplary embodiments, the channel areas 173 may have a cavity shape having an empty inside. The insides of the channel areas 173 may be filled with an embedded insulating layer 175. The plurality of gate electrode layers 150 may provide a plurality of second semiconductor devices in the cell region C, with, for example, the channel areas 173 and the gate insulating layer 160.

An upper surface of the first substrate 110 may be substantially parallel to an upper surface of the second substrate 115. The upper surfaces of the first substrate 110 and the second substrate 115 may be defined as an x-y plane. The first substrate 110 may include a semiconductor material, such as, a Group IV semiconductor material, a Group III-V compound semiconductor material, or a Group II-VI semiconductor oxide. For example, the first substrate 110 may include a Group IV semiconductor material, and the first substrate 110 may be a silicon substrate, for example, a single crystalline silicon substrate. The first substrate 110 may be provided in the form of a bulk wafer or an epitaxial layer.

The second substrate 115 may be disposed on the peripheral circuit region P. Referring to FIG. 4, the second substrate 115 may include first regions 115a disposed in a plurality of grooves on the first interlayer insulating layer 117, and a second region 115b disposed on the first regions 115a. The first regions 115a may be provided as seed layers for forming the second region 115b, and the second region 115b may be a region crystallized from the first regions 115a. The first regions 115a may fill the plurality of grooves and, at the same time, may be coplanar with an upper surface of the first interlayer insulating layer 117.

Both of the first regions 115a and the second region 115b may include polysilicon. The first regions 115a may be formed by filling the plurality of grooves disposed on the first interlayer insulating layer 117 with amorphous silicon (a-Si) and laser-annealing the amorphous silicon (a-Si). The second region 115b may be formed by forming an amorphous silicon layer on the first regions 115a and the first interlayer insulating layer 117, melting the amorphous silicon layer using laser-annealing, and crystallizing the melted amorphous silicon layer. In the crystallization process after the amorphous silicon layer for forming the second region 115b is melted, the first regions 115a may be used as seed layers. The amorphous silicon layer melted by laser-annealing may be crystallized, and the second region 115b may be formed by a sequential lateral solidification (SLS) process using the first regions 115a as seed layers.

The second region 115b may be formed by the SLS process using the first regions 115a as seed layers, and crystal grains included in the second region 115b may be lateral grains crystallized from the first regions 115a in a lateral direction (a y-axis direction in FIG. 4). The plurality of first regions 115a may be used as seed layers, grain boundaries may exist between the lateral grains in a direction crossing the upper surface of the first interlayer insulating layer 117 in the second region 115b disposed between the first regions 115a, and leakage characteristics of the second substrate 115 may be degraded due to, for example, the grain boundaries disposed between the lateral grains in portions of the second region 115b disposed between the plurality of first regions 115a.

According to an exemplary embodiment, described with reference to FIG. 4, in order to minimize degradations in characteristics due to, for example, the grain boundaries disposed between the lateral grains, the word-line cuts 107 dividing the plurality of gate electrode layers 150 into the plurality of unit blocks UC may be disposed between the plurality of first regions 115a in the cell region C. For example, the word-line cuts 107 may be disposed on the grain boundaries between the lateral grains in the second region 115b.

The channel areas 173 and an epitaxial layer 103 may be disposed between the word-line cuts 107. The epitaxial layer 103 may be formed by forming a plurality of holes exposing the second region 115b in order to form the channel areas 173 and performing a selective epitaxial growth (SEG) process in a portion of the second region 115b exposed by the plurality of holes. In an exemplary embodiment, the second region 115b may be formed by the SLS process using the first regions 115a as seed layers, and surfaces of the second region 115b exposed by the plurality of holes may have the same or equivalent crystal facets. Differences in growth rates of the second region 115b in the plurality of holes may be minimized, and variations in the height of the epitaxial layer 103 may be reduced.

Referring again to FIG. 4, each of the plurality of circuit devices 120 included in the peripheral circuit region P may include a gate electrode 121, a source electrode 122, and a drain electrode 123. Gate spacers 124 may be disposed on both side surfaces of the gate electrode 121. The first interlayer insulating layer 117 covering the plurality of circuit devices 120 may include a high density plasma (HDP) oxide layer to effectively fill spaces between the plurality of circuit devices 120. In a process of manufacturing the memory device 100, at least one portion of the first interlayer insulating layer 117 may be removed by, for example, a chemical mechanical polishing (CMP) process, to planarize the upper surface of the first interlayer insulating layer 117. Metal lines 125 electrically connected to the plurality of circuit devices 120 may be disposed in the first interlayer insulating layer 117.

As illustrated in FIG. 4, the peripheral circuit region P including the plurality of circuit devices 120 may be disposed below the cell region C, and the first substrate 110 for forming the plurality of circuit devices 120 and the second substrate 115 for forming the plurality of channel areas 173 and the plurality of gate electrode layers 150 may be required. The second substrate 115 may be formed by depositing polysilicon on the first interlayer insulating layer 117. However, grains of the second substrate 115 may not be sufficiently grown, and a plurality of defects may be generated in the second substrate 115. In the SEG process for forming the epitaxial layer 103, due to, for example, the differences in growth rates according to a crystal orientation of the exposed surface of the second substrate 115, variations in the height of the epitaxial layer 103 may be generated.

In an exemplary embodiment, the first regions 115a may be formed in the plurality of grooves of the first interlayer insulating layer 117, and the second region 115b may be formed by crystallizing the amorphous silicon layer formed on the first regions 115a, using the first regions 115a as seed layers. Crystallinity of the second region 115b disposed to be adjacent to the channel areas 173, the gate electrode layers 150, and the epitaxial layer 103 may be improved by increasing sizes of the grains of the second region 115b and laterally crystallizing the grains of the second region 115b, at the same time. Variations in the height of the epitaxial layer 103 may be minimized and the overall characteristics of the memory device 100 may be improved.

The channel areas 173 may extend in a direction perpendicular to the upper surface of second substrate 115 (a z-axis direction in FIG. 4) on the second substrate 115. As described above, the channel areas 173 may be formed in an annular shape surrounding the embedded insulating layer 175 therein. In some exemplary embodiments, the channel areas 173 may be formed in a pillar shape, such as a cylindrical or prismatic shape, with no embedded insulating layer 175. The channel areas 173 may be narrowed toward the second substrate 115 to have inclined side surfaces depending on the aspect ratio thereof.

The channel areas 173 may be disposed to be spaced apart from each other in the x-axis direction and the y-axis direction. The number and arrangement of the channel areas 173 may be modified according to various exemplary embodiments. For example, the channel areas 173 may be disposed in zigzag patterns in at least one direction. The channel areas 173 disposed adjacently to each other with the word-line cuts 107 therebetween may be, for example, symmetrically arranged as illustrated in FIG. 4.

Lower surfaces of the channel areas 173 may be electrically connected to the second substrate 115 via the epitaxial layer 103. The channel areas 173 may include a semiconductor material, such as polysilicon or single crystalline silicon, and the semiconductor material may be undoped or may include p-type or n-type impurities.

The plurality of gate electrode layers 150 may be disposed on the second substrate 115 on the side surfaces of the channel areas 173. Referring further to the equivalent circuit diagram illustrated in FIGS. 2A to 2C, each of the plurality of gate electrode layers 150 may form gates of the ground select transistor GST, the plurality of memory cells MC1 to MCn, and the string select transistor SST. The gate electrode layers 150 may extend to form the word lines WL1 to WLn, and may be commonly connected by adjacent memory cell strings S arranged in the x-axis direction and the y-axis direction. In an exemplary embodiment, for example, six gate electrode layers 152 to 157 of the memory cells MC1 to MCn may be arranged. Depending on the capacity of the memory device 100, the number of the gate electrode layers 152 to 157 of the memory cells MC1 to MCn may be determined. For example, the number of memory cells MC1 to MCn may be $2^n$ (where n is a natural number).

Gate electrode layers 151 of the ground select transistors GST may form the ground select lines GSL. Gate electrode layers 158 of the string select transistors SST may form the string select lines SSL. In particular, the gate electrode layers 158 of the string select transistors SST may be separated from each other among the adjacent memory cell strings S to form different string select lines SSL. In some exemplary embodiments, two or more gate electrode layers 158 of the string select transistors SST and two or more gate electrode layers 151 of the ground select transistors GST may be disposed, or the gate electrode layers 158 of the string select transistors SST and the gate electrode layer 151 of the ground select transistor GST may have different structures from the gate electrodes 152 to 157 of the memory cells MC1 to MCn.

The plurality of gate electrode layers 150 may include a polysilicon or a metal silicide material. The metal silicide material may be a silicide material of a metal selected from among Co, Ni, Hf, Pt, W, and Ti, for example. In some exemplary embodiments, the plurality of gate electrode layers 150 may include a metal, such as W. The plurality of gate electrode layers 150 may further include a diffusion barrier layer. For example, the diffusion barrier layer may include one or more of WN, TaN, or TiN.

The plurality of insulating layers 140 may be disposed between the plurality of gate electrode layers 150. The plurality of insulating layers 140 may be arranged to be spaced apart from each other in the z-axis direction and to extend in the y-axis direction, like the plurality of gate electrode layers 150. The plurality of insulating layers 140 may include an insulating material, such as silicon oxide or silicon nitride.

The gate insulating layer 160 may be disposed between the plurality of gate electrode layers 150 and the channel areas 173. The gate insulating layer 160 may include a tunneling layer 162, a charge storage layer 164, and a blocking layer 166, sequentially stacked on the channel areas 173. This will be described in more detail with reference to FIG. 8, an enlarged view of part A in FIG. 4.

The tunneling layer 162 may allow charges to be tunneled into the charge storage layer 164 by an F-N tunneling mechanism. The tunneling layer 162 may include, for example, silicon oxide. The charge storage layer 164 may include a charge trapping layer or a floating gate conductive layer. For example, the charge storage layer 164 may include a dielectric material, quantum dots, or nanocrystals. The quantum dots or nanocrystals may be formed of microparticles of a conductive material, such as a metal or a semiconductor material. The blocking layer 166 may include a high-k dielectric material. The high-k dielectric material may refer to a dielectric material having a higher dielectric constant than silicon oxide.

In upper end portions of the memory cell strings S, drain areas 170 may be disposed to cover upper surfaces of the embedded insulating layer 175 and may be electrically connected to the channel areas 173. The drain areas 170 may include, for example, doped polysilicon. The drain areas 170 may serve as drain areas of the string select transistors SST (please refer to FIG. 2A).

In lower end portions of the memory cell strings S, source areas 105 of the ground select transistors GST (please refer to FIGS. 2A to 2C) arranged in the x-direction may be disposed. The source areas 105 may extend in the x-axis direction to be adjacent to the upper surface of the second substrate 115 and may be arranged to be spaced apart at predetermined intervals in the y-axis direction. For example, one source area 105 may be arranged for two channel areas 173 in the y-axis direction. The word-line cuts 107 may be formed on the source areas 105. In some exemplary embodiments, a conductive layer extending in the z-axis and x-axis directions may be formed in the word-line cuts 107 to be connected to the source areas 105. The conductive layer may be electrically isolated from the plurality of gate electrode layers 150 by the word-line cuts 107 in the y-axis direction.

When the source areas 105 have an opposite conductivity type to the second substrate 115, the source areas may serve as source areas of adjacent ground select transistors GST, and may be connected to the common source line CSL illustrated in FIG. 2A. When the source areas 105 have the same conductivity type as the second substrate 115, the source areas 105 may serve as contact electrodes of a pocket p-well for an erasing operation of the memory cell strings in block units. By applying a high voltage to the second substrate 115 through a pocket p-well contact electrode, data stored in every memory cell of a corresponding memory cell block in the second substrate 115 may be erased.

Figure 8:
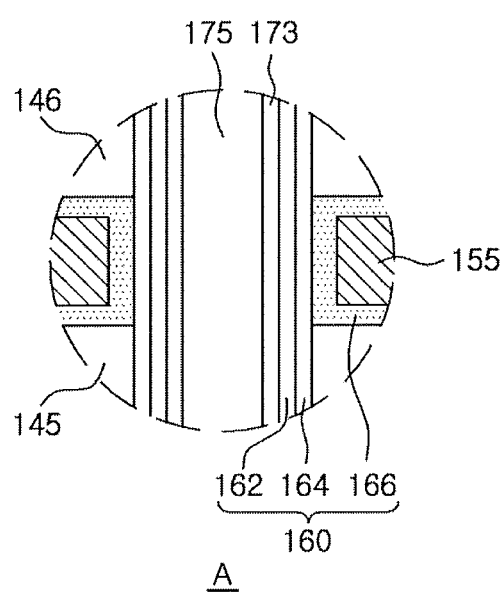
FIG. 8 illustrates an enlarged view of a portion of the memory device illustrated in FIG. 4.

Next, a gate insulating layer 160 included in the memory device 100 in FIG. 4 will be described with reference to FIG. 8. FIG. 8 illustrates a partially enlarged view of part A in FIG. 4.

Referring to FIG. 8, the gate electrode layer 155, the interlayer insulating layers 145 and 146, the gate insulating layer 160, and the channel area 173, included in part A of FIG. 4 are illustrated. The embedded insulating layer 175 may be disposed on inner surfaces of the channel areas 173. The gate insulating layer 160 may have a laminate structure in which the tunneling layer 162, the charge storage layer 164, and the blocking layer 166 are sequentially stacked on the channel areas 173. Relative thicknesses of the layers forming the gate insulating layer 160 may be variously changed.

The tunneling layer 162 may include one or more of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), or zirconium oxide ($ZrO_2$).

The charge storage layer 164 may be a charge trapping layer or a floating gate conductive layer. When the charge storage layer 164 is the floating gate, the charge storage layer 164 may be formed by, for example, depositing polysilicon by a low pressure chemical vapor deposition (LPCVD) process. When the charge storage layer 164 is the charge trapping layer, the charge storage layer 164 may include one or more of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), or aluminum gallium nitride ($AlGa_xN_y$).

The blocking layer 166 may include silicon oxide ($SiO_2$), silicon nitride ($Si_3N_4$), silicon oxynitride (SiON), or a high-K dielectric material. The high-K dielectric material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In FIG. 8, the blocking layer 166 is illustrated as including a single layer. In embodiments, the blocking layer 166 may include layers having different dielectric constants, for example, a high-K dielectric layer and a low-K dielectric layer. The low-K dielectric layer may be disposed to be in contact with the charge storage layer 164. The high-K dielectric layer may be formed of a material having a higher dielectric constant than the tunneling layer 162, and the low-K dielectric layer may be formed of a material having a lower dielectric constant than the high-K dielectric layer. By disposing the low-K dielectric layer on side surfaces of the high-K dielectric layer, an energy band such as a barrier height may be controlled, and characteristics of a nonvolatile memory device, such as erase characteristics, may be improved.

Figure 5:
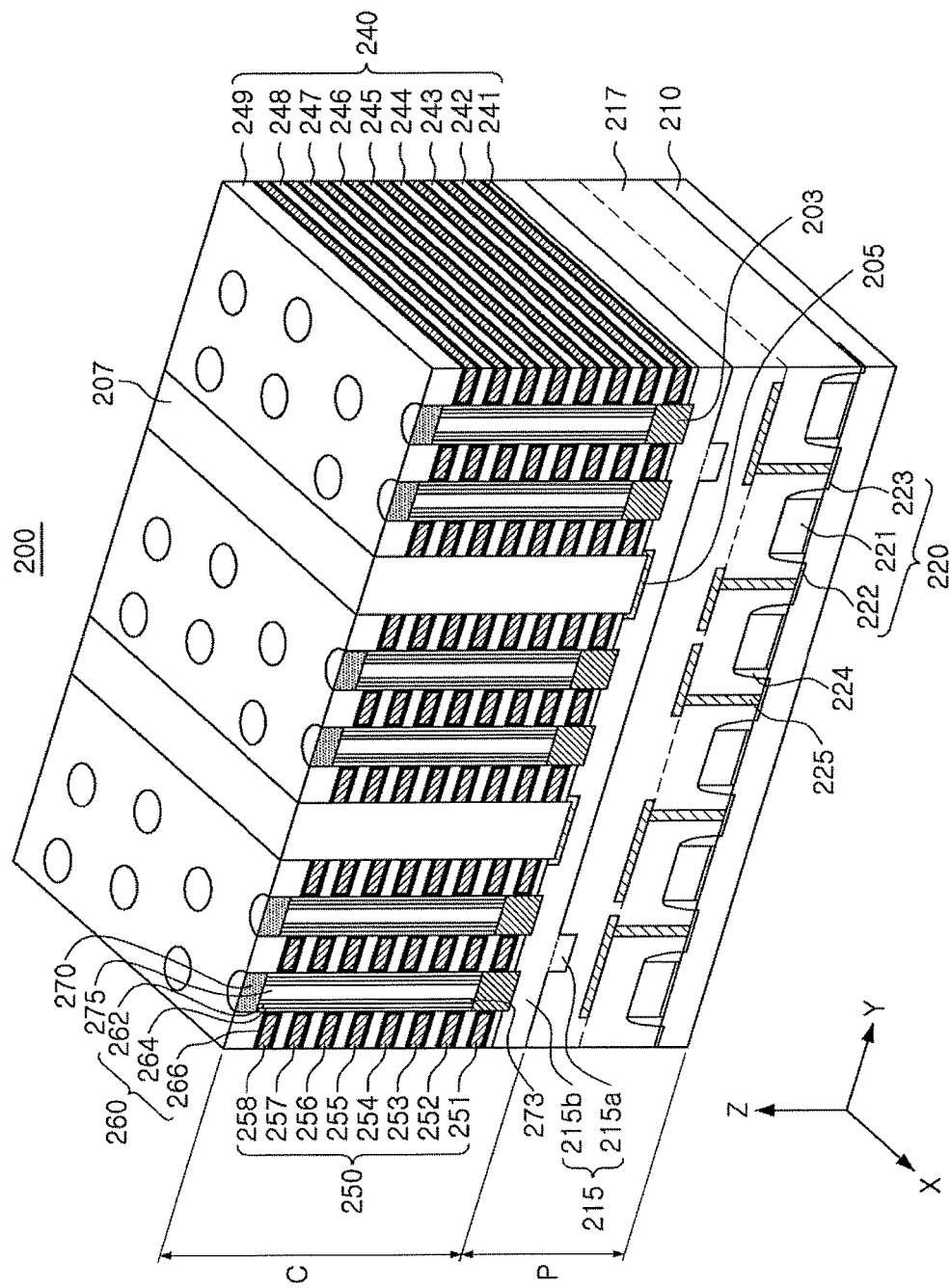

FIG. 5 illustrates a perspective view of a memory device 200 according to an exemplary embodiment.

Some components included in the memory device 200 according to the exemplary embodiment illustrated in FIG. 5 may be similar to those included in the memory device 100 according to the exemplary embodiment illustrated in FIG. 4. Referring to FIG. 5, the memory device 200 may include a first memory region and a second memory region disposed on the first memory region, and the first memory region and the second memory region may be a peripheral circuit region P and a cell region C, respectively. The memory device 200 according to the exemplary embodiment illustrated in FIG. 5 may have a COP structure in which the second memory region provided as the cell region C is disposed on the first memory region provided as the peripheral circuit region P.

The peripheral circuit region P may include a first substrate 210, a plurality of first semiconductor devices 220 disposed on the first substrate 210, and a first interlayer insulating layer 217 covering the plurality of first semiconductor devices 220. Metal lines 225 connected to the plurality of first semiconductor devices 220 may be formed in the first interlayer insulating layer 217. The plurality of first semiconductor devices 220 may be provided as a plurality of circuit devices.

The plurality of circuit devices 220 may be transistor devices for applying a predetermined electric signal to, for example, a memory cell, a ground select transistor, and a string select transistor, included in the cell region C, and may include a gate electrode 221, a source electrode 222, and a drain electrode 223. Gate spacers 224 may be formed on outer sidewalls of the gate electrode 221.

A plurality of grooves may be disposed on the first interlayer insulating layer 217, and first regions 215a included in the second substrate 215 may be formed in a plurality of grooves. A second region 215b may be formed on the first regions 215a by melting an amorphous silicon layer and crystallizing the melted amorphous silicon layer using the first regions 215a as seed layers. The second region 215b may include lateral grains and have a larger grain size than the first regions 215a.

The cell region C may include channel areas 273 extending in a direction perpendicular to an upper surface of the second substrate 215, and a plurality of gate electrode layers 250 (including layers 251 to 258) and a plurality of insulating layers 240 (including layers 241 to 249) alternately stacked on the second substrate 215 to be adjacent to the channel areas 273. A gate insulating layer 260 may be formed between the plurality of gate electrode layers 250 and the channel areas 273, and an embedded insulating layer 275 may be disposed on inner surfaces of the channel areas 273. The channel areas 273 may be electrically connected to drain areas 270 at the top thereof in a longitudinal direction (the z-axis direction in FIG. 5). The channel areas 273 may be electrically connected to the second substrate 215 at the bottom thereof in the longitudinal direction, and epitaxial layers 203 may be formed between the channel areas 273 and the second substrate 215.

In the cell region C, the plurality of gate electrode layers 250 and the plurality of insulating layers 240 may be divided into a plurality of unit blocks by word-line cuts 207, and source areas 205 may be formed below the word-line cuts 207. Selectively, a conductive layer extending in the y-axis and z-axis directions may be formed in the word-line cuts 207 and connected to the source areas 205. The conductive layer may be electrically isolated from the plurality of gate electrode layers 250 by the word-line cuts 207.

The number of first regions 215a included in the second substrate 215 in the memory device 200 according to the exemplary embodiment illustrated in FIG. 5 may be different from the number of the memory device 100 according to the exemplary embodiment illustrated in FIG. 4. For example, the first regions 115a may exist between every word-line cut 107 in the memory device 100 according to the exemplary embodiment illustrated in FIG. 4, but the first regions 215a may not exist between some of the word-line cuts 207 in the memory device 200 according to the exemplary embodiment illustrated in FIG. 5.

Figure 6:
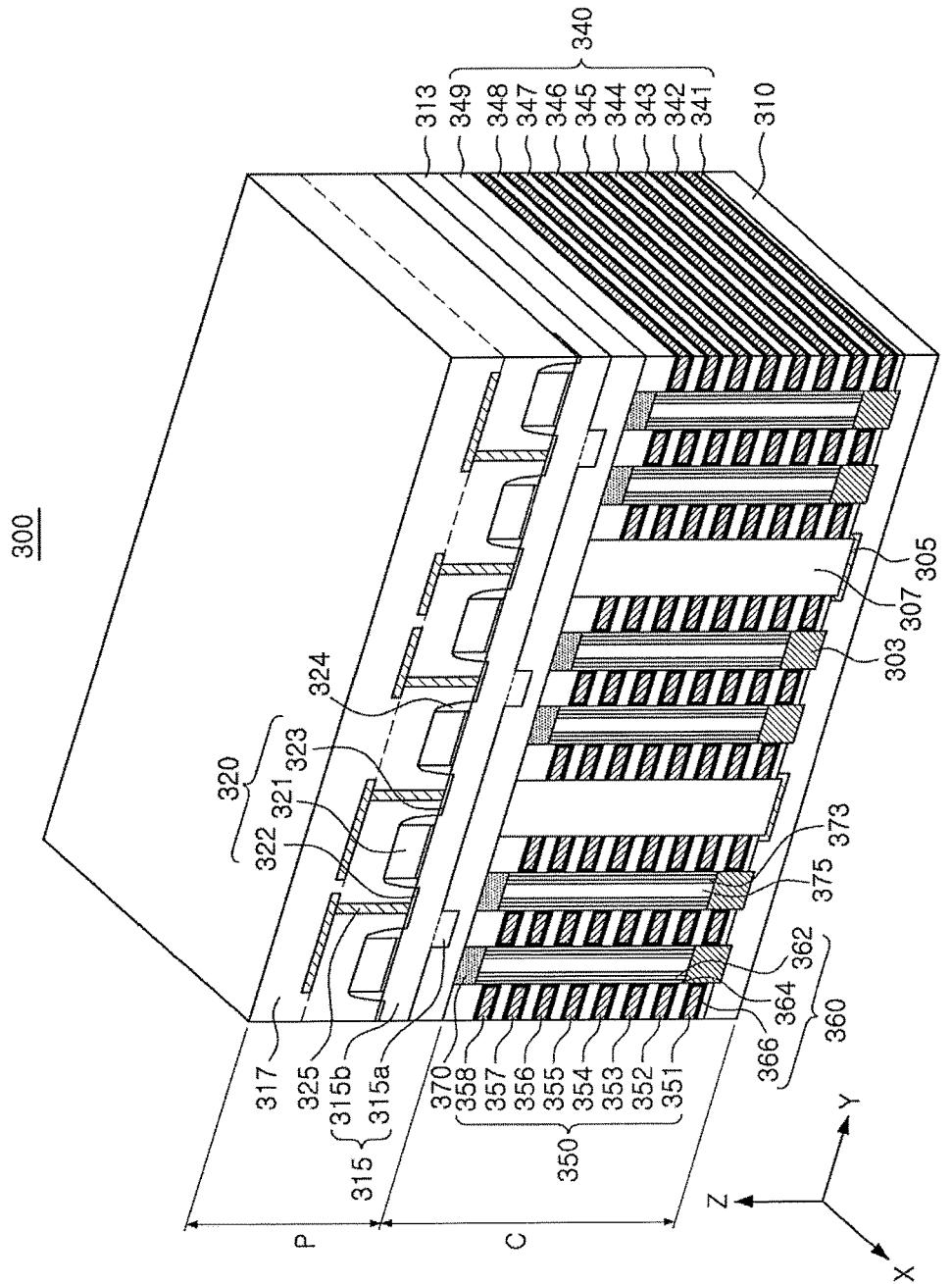

FIG. 6 illustrates a perspective view of a memory device 300 according to an exemplary embodiment different from the exemplary embodiment illustrated in FIGS. 4 and 5.

Referring to FIG. 6, the memory device 300 may include a first memory region and a second memory region disposed on the first memory region. In the exemplary embodiment illustrated in FIG. 6, the first memory region may be provided as a cell region C, and the second memory region may be provided as a peripheral circuit region P. For example, the memory device 300 according to the exemplary embodiment illustrated in FIG. 6 may have a POC structure in which the peripheral circuit region P is disposed on the cell region C. Components included in the peripheral circuit region P and the cell region C, and characteristics thereof may be similar to those described with reference to FIGS. 4 and 5.

In the exemplary embodiment illustrated in FIG. 6, a first substrate 310 included in the cell region C may be a single crystalline silicon substrate, and a second substrate 315 included in the peripheral circuit region P may be a polysilicon substrate. The second substrate 315 may include a first region 315a and a second region 315b.

A plurality of gate electrode layers 350 (including layers 351 to 358) and a plurality of insulating layers 340 (including layers 341 to 349) may be alternately stacked on the first substrate 310, and the plurality of gate electrode layers 350 may be disposed adjacently to channel areas 373. Gate insulating layers 360 may be disposed between the channel areas 373 and the plurality of gate electrode layers 350, and embedded insulating layers 375 may fill the channel areas 373. The first substrate 310 and the channel areas 373 may be electrically connected by epitaxial layers 303, and the epitaxial layers 303 may be layers formed by removing portions of an upper surface of the first substrate 310 and performing an SEG process. The plurality of gate electrode layers 350, the channel areas 373, and the gate insulating layers 360 may configure a plurality of first semiconductor devices.

The cell region C may include word-line cuts 307, and the cell region C may be divided into a plurality of unit blocks by the word-line cuts 307. Source areas 305 may be formed below the word-line cuts 307. Drain areas 370 may be formed on the channel areas 373. A first interlayer insulating layer 313 may be formed on the drain areas 370, and metal lines connected to the drain areas 370 may be disposed in the first interlayer insulating layer 313.

The second substrate 315 included in the peripheral circuit region P may include first regions 315a filling a plurality of grooves disposed in a separation insulating layer 313, and a second region 315b formed on the first regions 315a. The first regions 315a may be formed by filling the plurality of grooves with amorphous silicon and crystallizing the amorphous silicon using an annealing process such as laser annealing. The second region 315b may be formed by forming an amorphous silicon layer on the first regions 315a, melting the amorphous silicon layer by laser annealing, and crystallizing the melted amorphous silicon layers using the first regions 315a as seed layers. The melted amorphous silicon layer may be crystallized by, for example, an SLS process.

A plurality of second semiconductor devices 320, a second interlayer insulating layer 317, and metal lines 325 may be disposed on the second substrate 315. The metal lines 325 may be disposed in the second interlayer insulating layer 317, and connected to gate electrodes 321, source electrodes 322, and drain electrodes 323 included in a plurality of circuit devices 320. Gate spacers 324 may be disposed on outer side surfaces of the gate electrodes 321.

Figure 7:
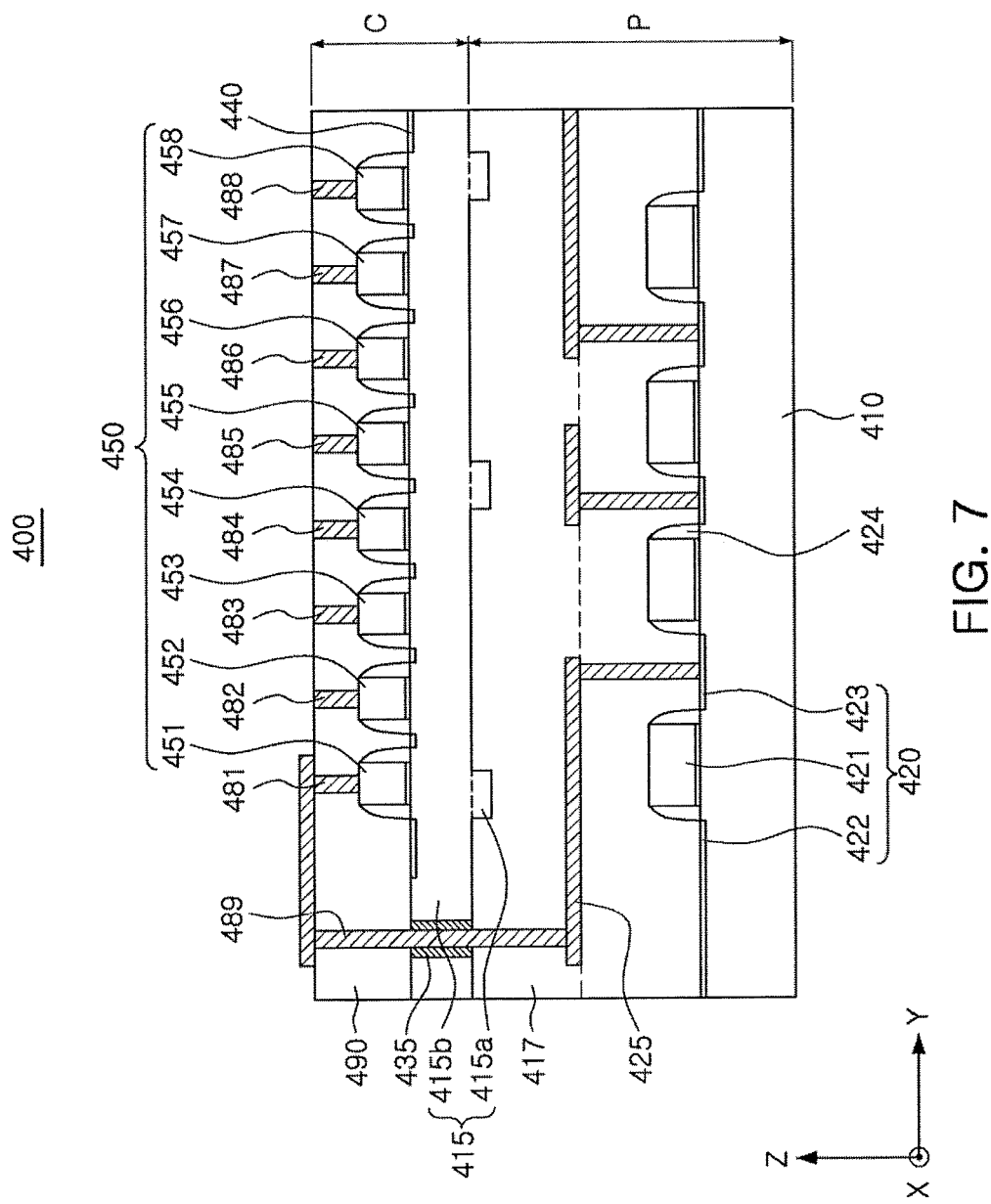

FIG. 7 illustrates a cross-sectional view of a memory device according to an exemplary embodiment. In FIG. 7, a horizontal memory device is illustrated as a memory device 400 according to an exemplary embodiment.

The memory device 400 illustrated in FIG. 7 may include a first memory region and a second memory region, arranged vertically, as different regions. In some exemplary embodiments, the first memory region may be a peripheral circuit region P, and the second memory region may be a cell region C disposed on the peripheral circuit region P. The peripheral circuit region P provided as the first memory region may include a first substrate 410 and a plurality of first semiconductor devices 420 formed in the first substrate 410, and the cell region C provided as the second memory region may include a second substrate 415, and a plurality of second semiconductor devices disposed on the second substrate 415. The plurality of second semiconductor devices may include a plurality of gate electrode layers 450 (including layers 451 to 458) providing memory cell transistors.

The first substrate 410 may be a single crystalline silicon substrate, and the second substrate 415 may be a polysilicon substrate. The second substrate 415 may include first regions 415a filling a plurality of grooves disposed in a first interlayer insulating layer 417 covering a plurality of circuit devices 420, and a second region 415b disposed on the first regions 415a. The first regions 415a may be formed by filling the plurality of grooves with amorphous silicon and performing laser annealing treatment on the amorphous silicon. The first regions 415a may include polysilicon, and upper surfaces of the first regions 415a may be coplanar with an upper surface of the first interlayer insulating layer 417.

The second region 415b may be formed by forming an amorphous silicon layer on the first regions 415a and the first interlayer insulating layer 417, melting the amorphous silicon layer by laser annealing, and crystallizing the melted amorphous silicon layer using the first regions 415a as seed layers. In some exemplary embodiments, the second region 415b may include polysilicon, and silicon grains of the second region 415b may be lateral grains. For example, the second region 415b may be formed by performing an SLS process on the amorphous silicon layer melted by laser annealing.

In the exemplary embodiment illustrated in FIG. 7, the plurality of gate electrode layers 450 providing the memory cell transistors may be disposed in a horizontal direction on an upper surface of the second substrate 415. Gate electrode layers 451 and 458 disposed to the right and left in a direction in which the plurality of gate electrode layers 450 are arranged side by side may be provided as a ground select transistors GST and a string select transistor SST, respectively.

The plurality of circuit devices 420 disposed on the first substrate 410 may be horizontal transistors, like the memory cell transistors, and may include gate electrodes 421, source electrodes 422, and drain electrodes 423. Gate spacers 424 may be disposed on both side surfaces of the gate electrodes 421, and the plurality of circuit devices 420 may be covered by the first interlayer insulating layer 417. The first interlayer insulating layer 417 may include an HDP oxide layer having good gap-filling characteristics.

At least a portion of the plurality of circuit devices 420 may be electrically connected at least a portion of the plurality of gate electrode layers 450 via metal lines 425 and contact plugs 481 to 489. A common source line CSL may be connected to a source electrode of a ground select transistor GST, and a bit line BL may be connected to a drain electrode of a string select transistor SST via additional contact plugs.

Referring to FIG. 7, a contact plug 489 connecting at least a portion of the plurality of circuit devices 420 to at least a portion of the plurality of gate electrode layers 450 may pass through a cell interlayer insulating layer 490 included in the cell region C, the second substrate 415, and the first interlayer insulating layer 417 included in the peripheral circuit region P. In order to electrically separate the second substrate 415 and the contact plug 489, a contact insulating layer 435 may be formed between the second substrate 415 and the contact plug 489.

Hereinafter, a method of manufacturing the memory devices illustrated in FIGS. 4 to 7 will be described with reference to FIGS. 9 to 12.

FIGS. 9A to 9F illustrate diagrams of a method of manufacturing a substrate, applicable to the memory devices 100, 200, 300, and 400 according to the various exemplary embodiments. The substrate fabricated according to the method illustrated in FIGS. 9A to 9F may be used as the second substrates 115, 215, 315, and 415 in the memory devices 100, 200, 300, and 400 according to the exemplary embodiments illustrated in FIGS. 4 to 7.

First, referring to FIG. 9A, a method of manufacturing a substrate 10 according to an exemplary embodiment may include forming a plurality of grooves 11 on an insulating layer 10. The insulating layer 10 may include silicon oxide or silicon nitride. The plurality of grooves 11 may be formed by selectively removing a portion of the insulating layer 10 from an upper surface of the insulating layer 10 to a predetermined depth. In some exemplary embodiments, the plurality of grooves 11 may be formed by selectively etching the portion of the insulating layer 10.

Figure 9C:
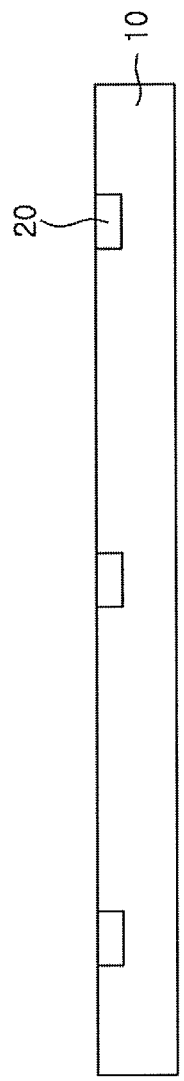

The plurality of grooves 11 may have a shape extending in a first direction (an x-axis direction in FIG. 9A). FIGS. 9A to 9F illustrate cross-sectional views of a method of manufacturing a substrate. The plurality of grooves 11 may have a shape extending in a first direction (the x-axis direction in FIG. 9A). Intervals between the plurality of grooves 11 may be constant or different, and depths of the plurality of grooves 11 may be the same or different, as needed.

Next, referring to FIG. 9B, the plurality of grooves 11 may be filled with amorphous silicon 20'. First regions 20 illustrated in FIG. 9C may be formed by filling the plurality of grooves 11 with amorphous silicon 20' and crystallizing the amorphous silicon 20' using an excimer laser annealing (ELA) process. The first regions 20 may include polysilicon crystallized from amorphous silicon 20'. After forming the first regions 20, upper surfaces of the first regions 20 and the insulating layer 10 may be planarized by partially removing the upper surfaces of the first regions 20 and the insulating layer 10 using a polishing process, such as CMP. The upper surfaces of the first regions 20 and the insulating layer 10 may become coplanar by the planarization process.

Figure 9D:
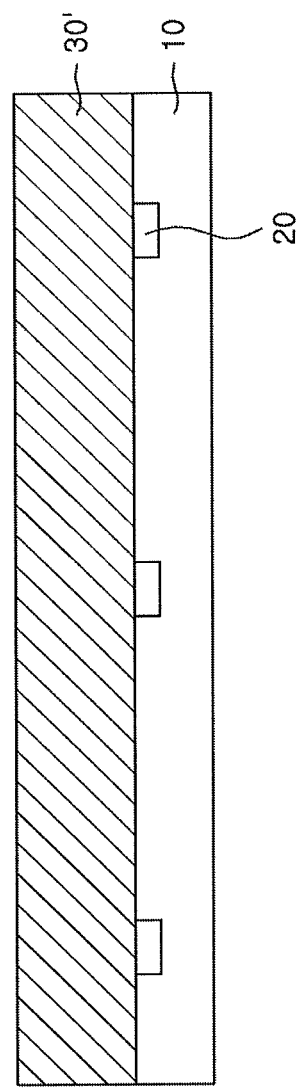

Next, referring to FIG. 9D, an amorphous silicon layer 30' may be formed on the insulating layer 10 and the first regions 20. The amorphous silicon layer 30' may be formed by a deposition process, and a thickness of the amorphous silicon layer 30' may be greater than a thickness of the first regions 20. When the amorphous silicon layer 30' is deposited, the amorphous silicon layer 30' may be melted by, for example, an ELA process, and the melted amorphous silicon layer 30' may be crystallized using the first regions 20 as seed layers.

The first regions 20 may be used as seed layers when the amorphous silicon layer 30' is crystallized, and the crystallization process may include an SLS process in which the amorphous silicon layer 30' is crystallized laterally from the first regions 20. Referring to the partially enlarged view in FIG. 9E, the first regions 20 may include a plurality of grains 21 and 22 of polysilicon, and at least a portion of the grains 21 and 22 included in a second region 30 formed by crystallizing the amorphous silicon layer 30' may extend from the first regions 20.

The second region 30 may be formed by laterally crystallizing the amorphous silicon layer 30', grains of the laterally crystallized second region 30 may form grain boundaries, and protrusions PT may be formed between the first regions 20 as illustrated in FIG. 9E. For example, among the plurality of grains included in the second region 30, the protrusions PT may be formed between the first regions 20 as illustrated in FIG. 9E due to, for example, the grain boundaries formed by the grains extending from different first regions 20.

Referring to FIG. 9F, the protrusions PT may be removed using a polishing process such as CMP, and an upper surface of the second region 30 may be planarized to be fabricated as the substrate. After removing the protrusions PT, the insulating layer 10 or the first regions 20 may be selectively removed to use only the second region 30 as the substrate.

Figure 10A:
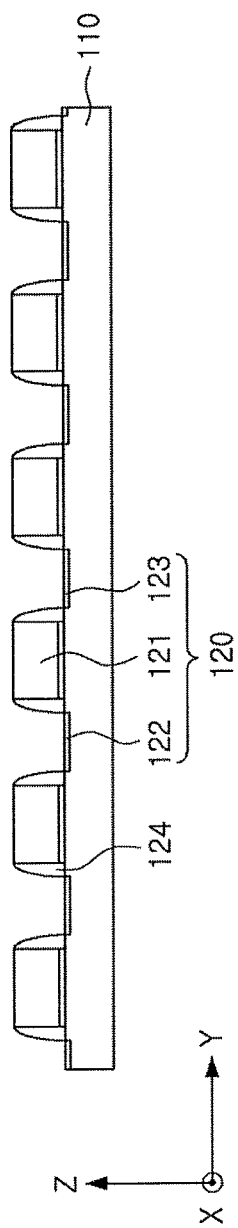
FIGS. 10A to 10N illustrate diagrams of a method of manufacturing the memory device illustrated in FIG. 4.
Figure 10B:
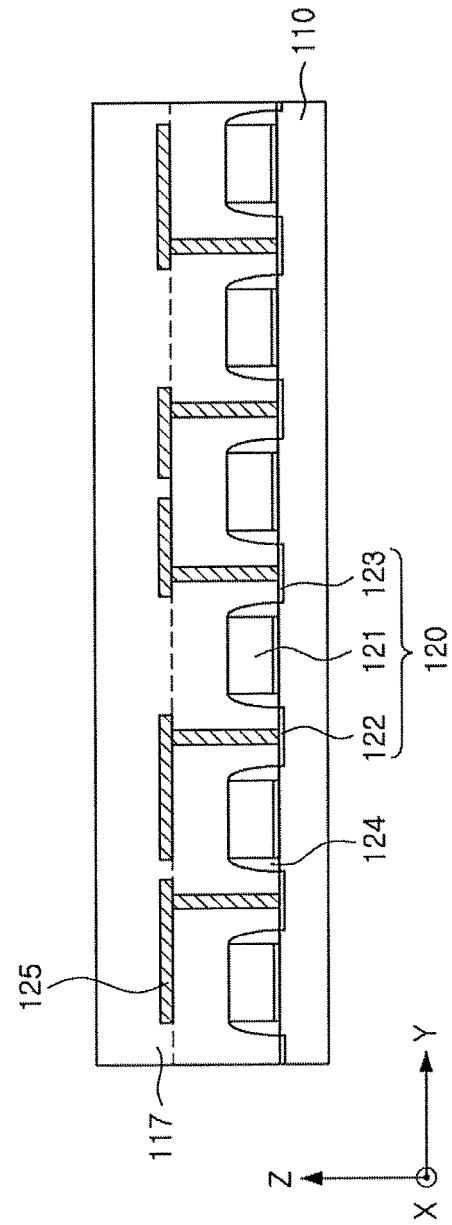
Figure 10E:
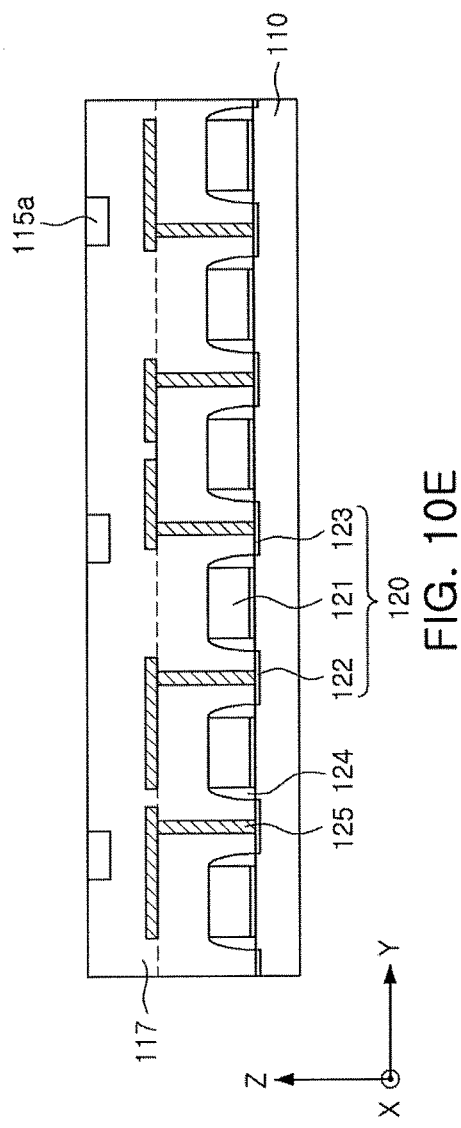
Figure 10F:
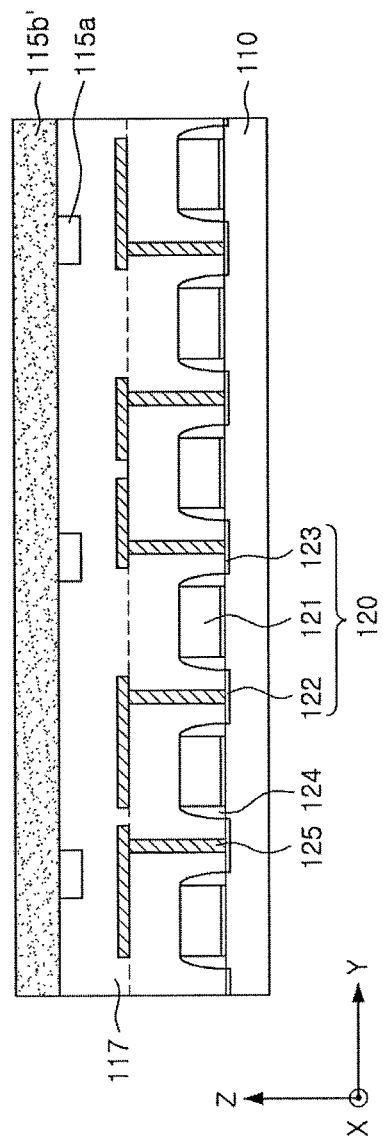
Figure 10G:
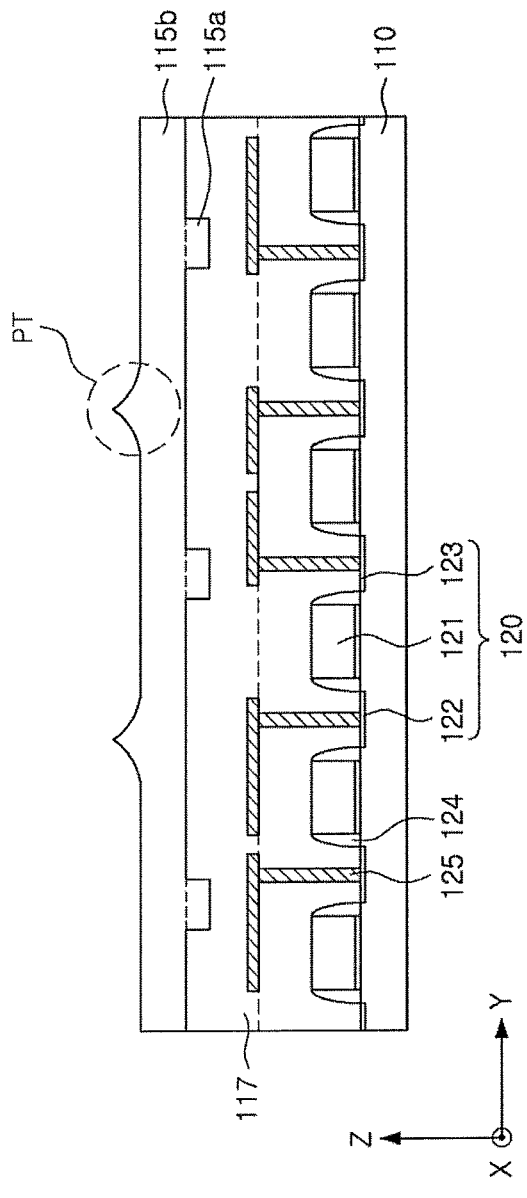
Figure 10H:
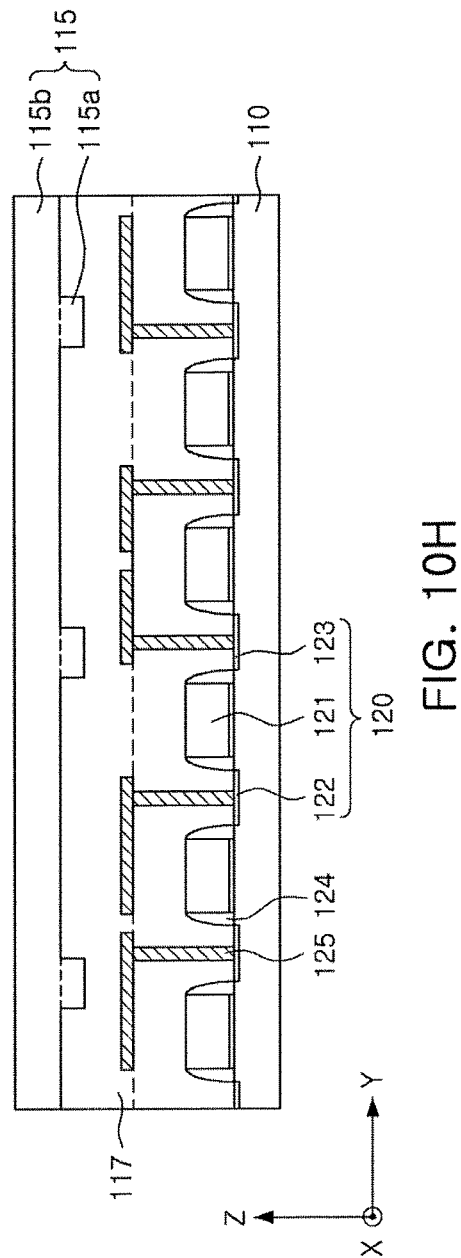
Figure 10I:
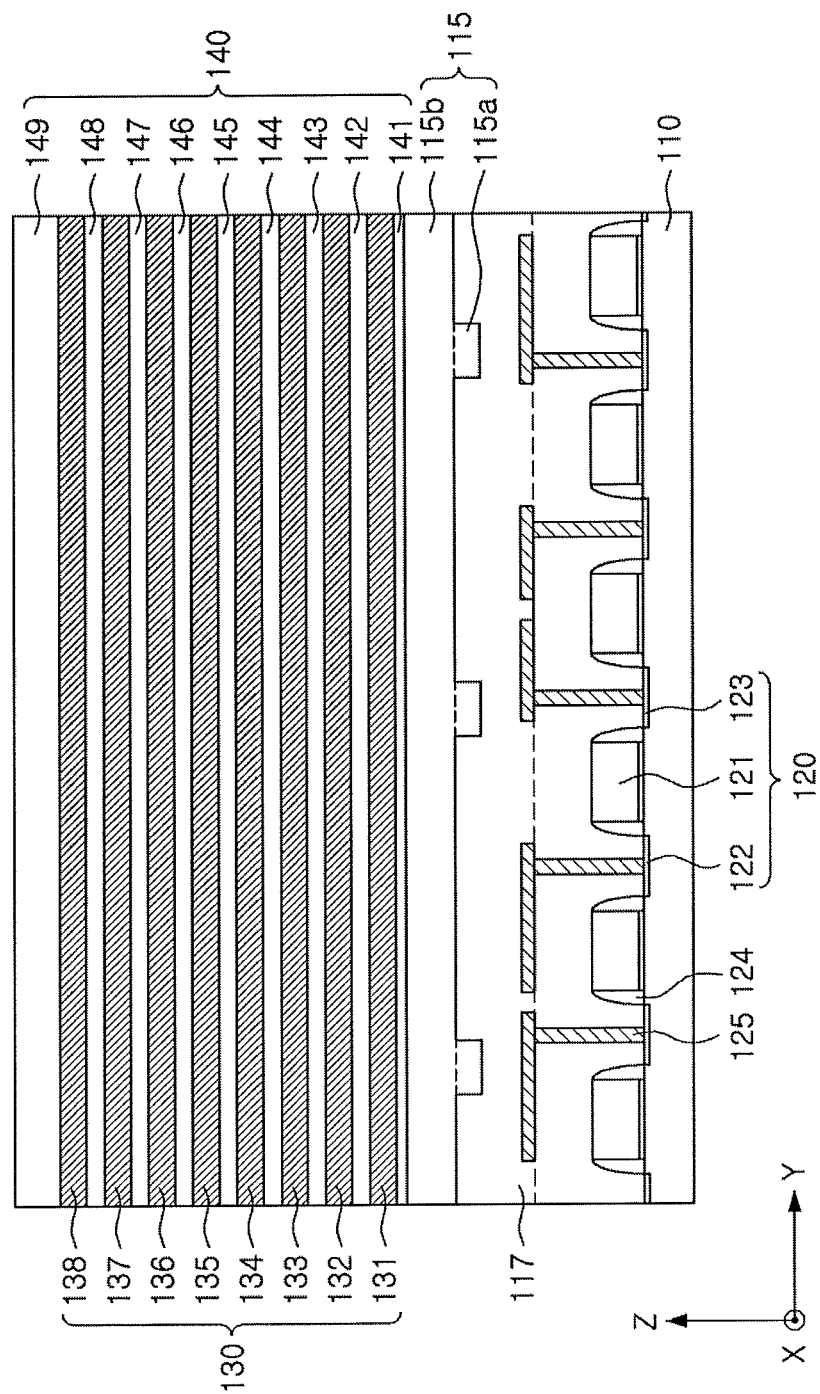
Figure 10J:
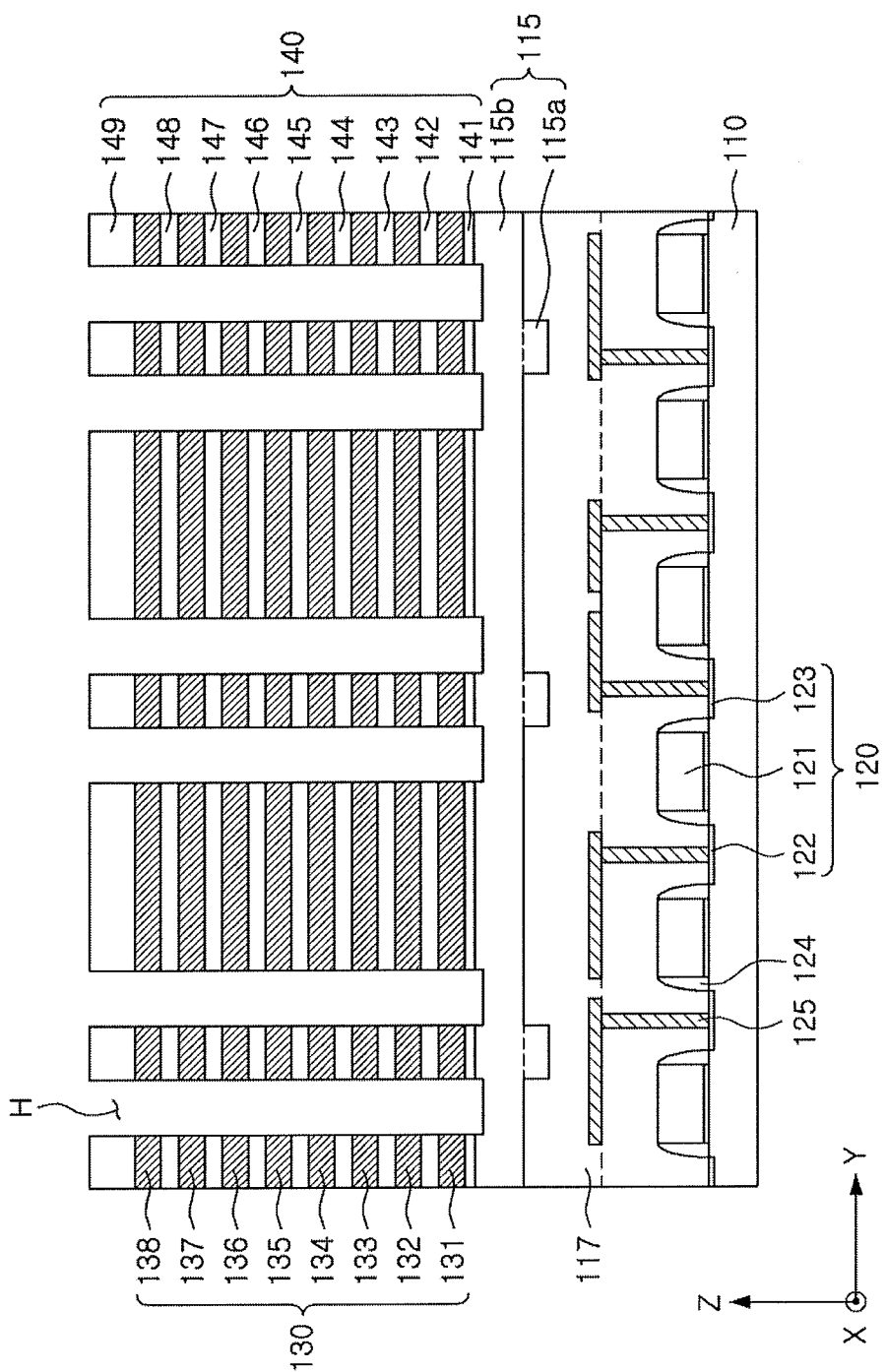
Figure 10K:
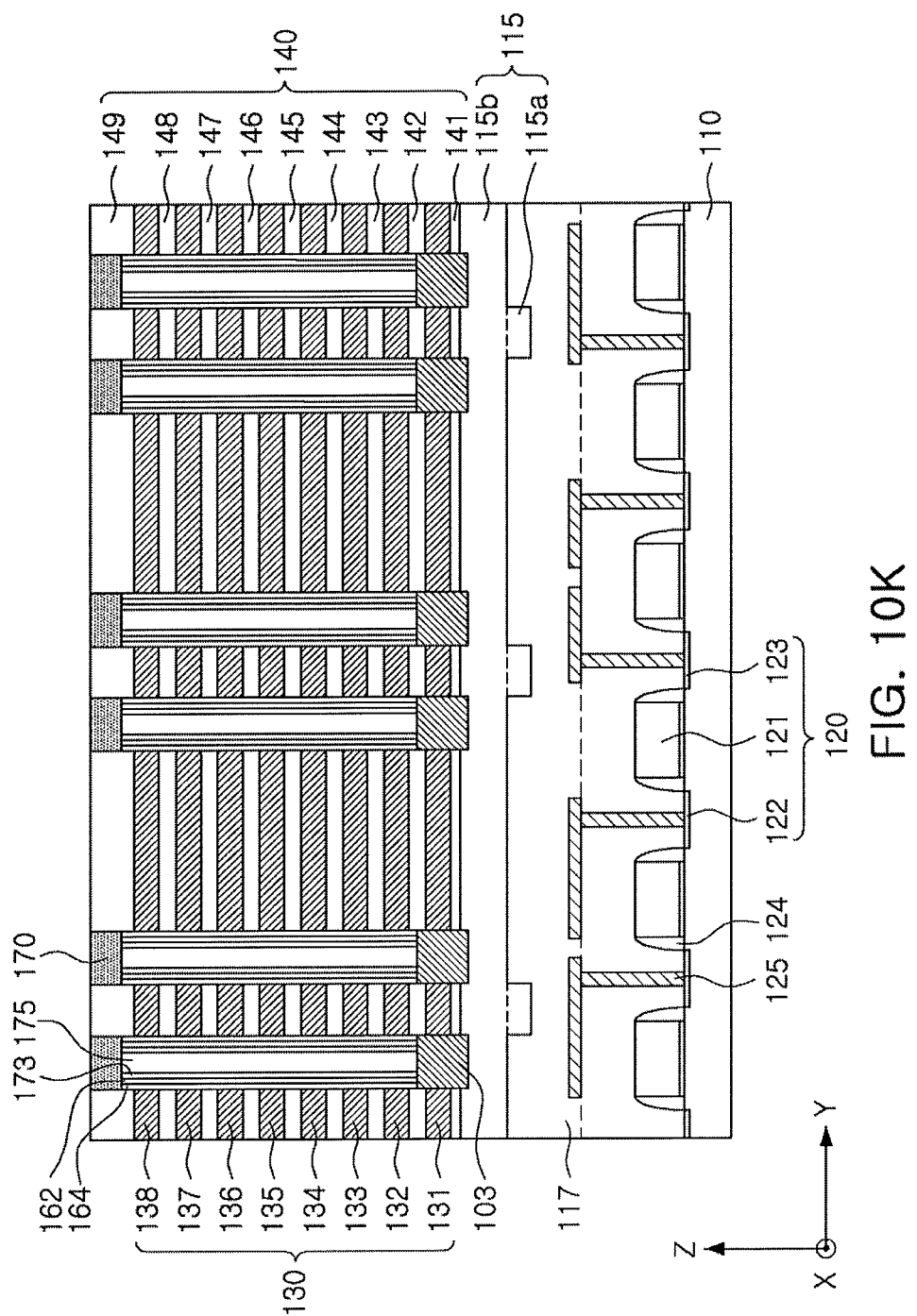
Figure 10L:
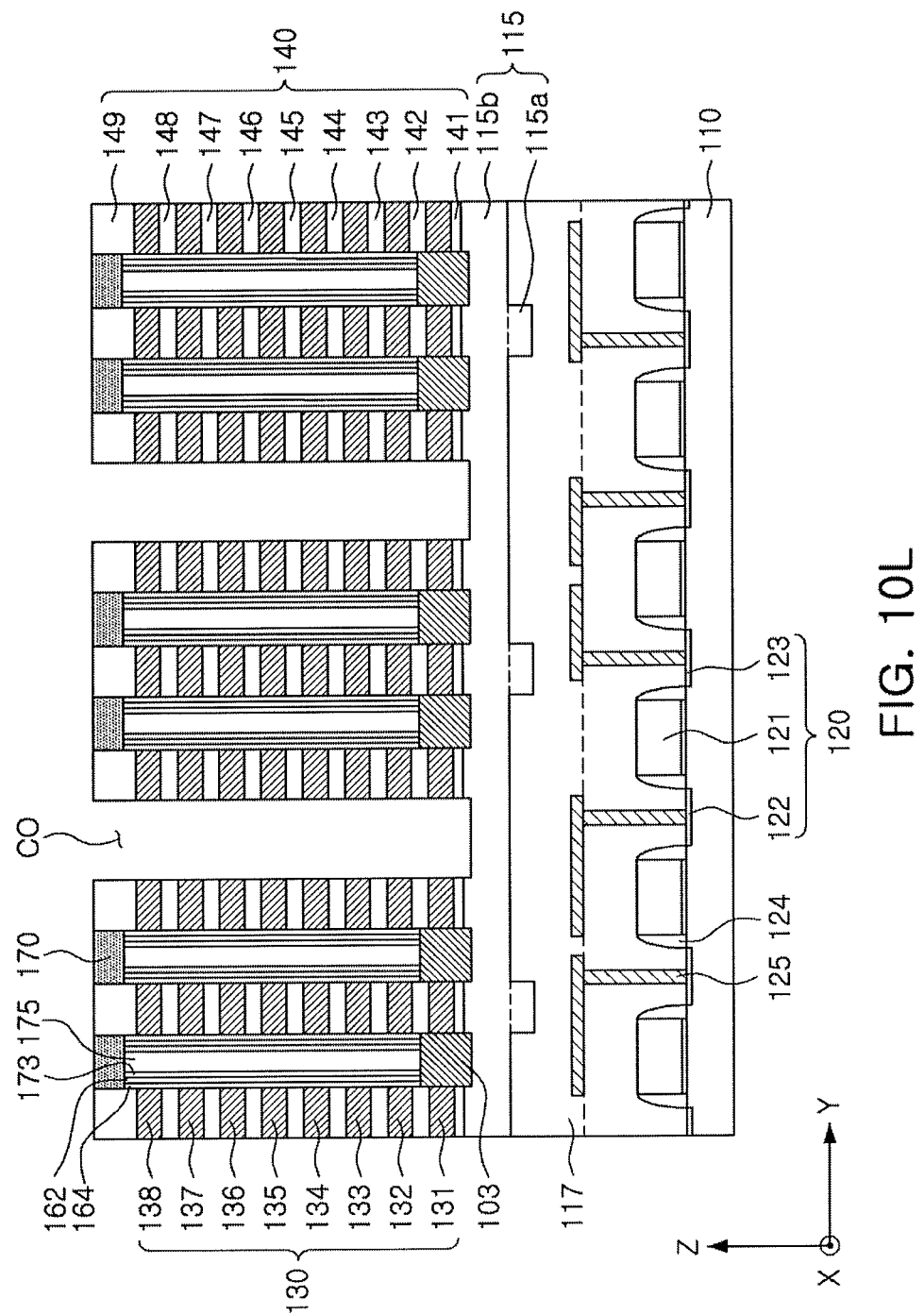
Figure 10M:
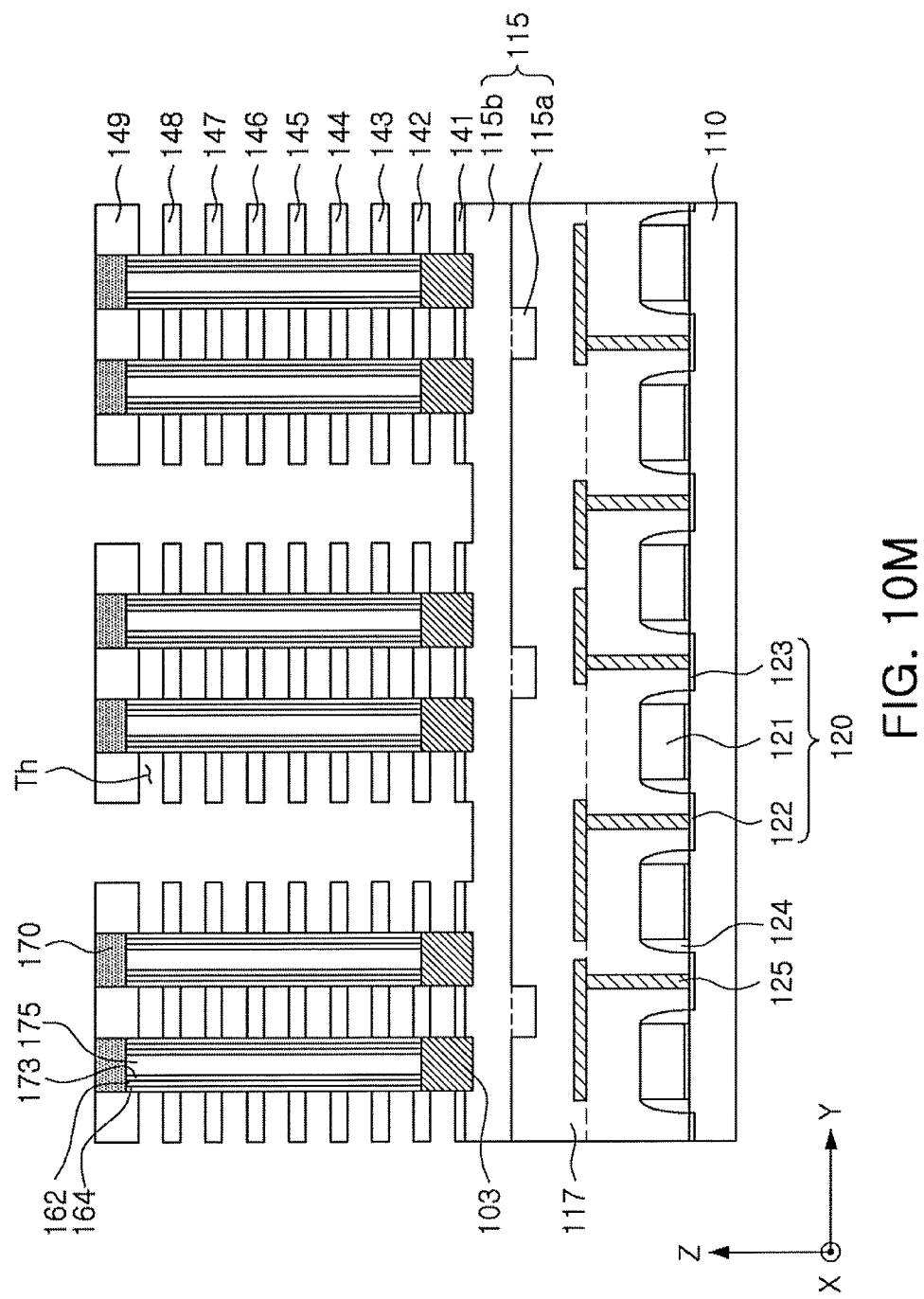
Figure 10N:
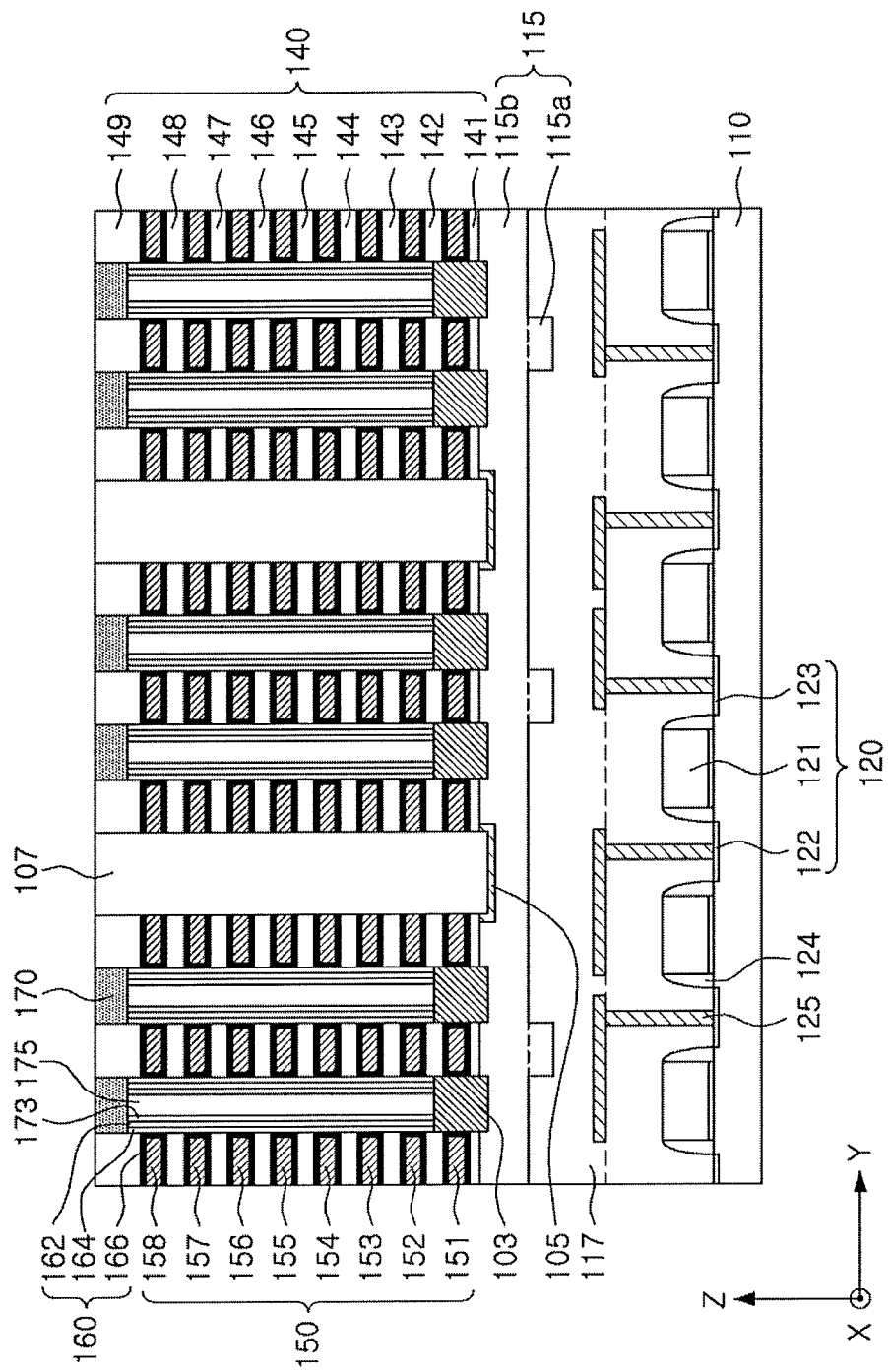

FIGS. 10A to 10N illustrate diagrams of a method of manufacturing the memory device 100 illustrated in FIG. 4. FIGS. 10A to 10N may be cross-sectional views of the perspective view of FIG. 3 in the x-axis direction, according to the process sequence.

Referring to FIG. 10A, a plurality of first semiconductor devices 120 may be formed on an upper surface of the first substrate 110. The plurality of first semiconductor devices 120 may be horizontal transistors, and each of the first semiconductor devices 120 may include a horizontal gate electrode 121, a horizontal source electrode 122, and a horizontal drain electrode 123. The horizontal source electrode 122 and the horizontal drain electrode 123 may be formed by a process of implanting impurities in the first substrate 110. The horizontal gate electrode 121 may be formed of polysilicon, a metal, or a laminate of polysilicon and a metal. A horizontal gate insulating layer may be further disposed between the horizontal gate electrode 121 and the first substrate 110, and gate spacers 121 may be disposed on side surfaces of the horizontal gate electrode 121. The gate spacers 121 may be formed by depositing silicon oxide on the horizontal gate electrode 121 with an MTO process and an etchback process.

Next, referring to FIG. 10B, the plurality of first semiconductor devices 120 may be covered by a first interlayer insulating layer 117. In order to effectively fill spaces between the plurality of first semiconductor devices 120, the first interlayer insulating layer 117 may include an HDP oxide layer having an excellent gap filling ability. When the first interlayer insulating layer 117 is formed, metal lines 125 including device contacts and horizontal interconnection lines electrically connected to the plurality of first semiconductor devices 120 in the first interlayer insulating layer 117 may be formed. The first substrate 110, the plurality of first semiconductor devices 120, the metal lines 125, and the first interlayer insulating layer 117 may be defined as a first memory region, and the first memory region may be provided as a peripheral circuit region P.

Referring to FIG. 10C, a plurality of grooves 117a may be formed on the first interlayer insulating layer 117. The plurality of grooves 117a may be formed by selectively removing portions of the first interlayer insulating layer 117. Although cross-sections of the plurality of grooves 117a are illustrated as having a tetragonal shape, they may have, for example, another polygonal, oval, or circular shape. Similar to those described with reference to FIG. 9A, depths of the plurality of grooves 117a or intervals between the plurality of grooves 117a may be modified.

Referring to FIG. 10D, the plurality of grooves 117a may be filled with amorphous silicon 115a'. Only the inside of the plurality of grooves 117a may be filled with the amorphous silicon 115a' by forming a mask exposing only the plurality of grooves 117a on the first interlayer insulating layer 117, depositing the amorphous silicon 115a', and removing the mask. Referring to FIG. 10E, first regions 115a may be formed by applying, for example, a laser annealing process, to the plurality of grooves 117a filled with the amorphous silicon 115a'. By the laser annealing process, the first regions 115a may include polysilicon. After forming first regions 115a, upper surfaces of the first regions 115a and the first interlayer insulating layer 117 may be planarized by removing high sections of the first regions 115a and the first interlayer insulating layer 117 using a polishing process. The upper surfaces of the first regions 115a and the first interlayer insulating layer 117 may be co-planar.

Next, referring to FIG. 10F, an amorphous silicon layer 115b' may be formed on the upper surfaces of the first regions 115a and the first interlayer insulating layer 117. The amorphous silicon layer 115b' may be formed using a deposition process, and the amorphous silicon layer 115b' may be crystallized by a laser annealing process to form a second region 115b. The second region 115b may be formed by crystallizing the melted amorphous silicon layer 115b' using the first regions 115a as seed layers. In some exemplary embodiments, the second region 115b may be formed in such a manner that the melted amorphous silicon layer 115b' is crystallized in a lateral direction from the first region 115a, and may be formed by an SLS process.

As illustrated in FIG. 10G, grains of the laterally crystallized second region 115b may form grain boundaries, and protrusions PT may be formed between the first regions 115a. As described above with reference to FIG. 9E, at least a portion of the plurality of grains included in the second region 115b may be extended from the grains included in the first region 115a. Due to, for example, the grain boundaries formed by the grains extending from different first regions 115a, the protrusions PT may be formed on an upper surface of the second region 115b.

Referring to FIG. 10H, the upper surface of the second region 115b may be planarized using a polishing process such as CMP. When the upper surface of the second region 115b is planarized, a plurality of sacrificial layers 130 (including layers 131 to 138) and a plurality of insulating layers 140 (including layers 141 to 149) may be alternately stacked as illustrated in FIG. 10I.

The plurality of sacrificial layers 130 may be formed of a material having high etch selectivity with respect to the plurality of insulating layers 140 so as to be selectively etched. The etch selectivity may be quantitatively expressed by a ratio of an etching rate of the sacrificial layers 130 to an etching rate of the insulating layer 140. For example, the insulating layers 140 may be one or more of a silicon oxide layer or a silicon nitride layer, and the sacrificial layers 130 may be one selected from a silicon layer, a silicon oxide layer, a silicon carbide layer, and silicon nitride layer, and may be formed of a different material from the insulating layer 140. For example, when the insulating layers 140 are formed of silicon oxide, the sacrificial layers 130 may be formed of silicon nitride.

According to various exemplary embodiments, thicknesses of the plurality of insulating layers 140 may be different. For example, the lowermost insulating layer 141 of the plurality of insulating layers 140 in the z-axis direction may be relatively thin compared to the other insulating layers 142 to 149, and the uppermost insulating layer 149 may be relatively thick compared to the other insulating layers 141 to 148. For example, the thicknesses of the plurality of insulating layers 140 and the plurality of sacrificial layers 130 are not be limited to those as illustrated in FIG. 10I, and may be variously modified. The number of layers configuring the plurality of insulating layers 140 and the plurality of sacrificial layers 130 may be variously modified.

Next, referring to FIG. 10J, in order to form channel areas 173, a plurality of openings H pass through the plurality of interlayer insulating layers 140 and sacrificial layers 130 in the z-axis direction. The number of the openings H may depend on the number of the channel areas 173. The plurality of openings H may be arranged in zigzag patterns on an x-y plane perpendicular to the z-axis, and spaced apart from each other on the x-y plane. The plurality of openings H may be formed by only exposing the areas in which the plurality of openings H may be formed, using a mask layer, and anisotropically etching the exposed areas. Each of the plurality of openings H may expose the upper surface of the second region 115b, or have a depth recessing the second region 115b to a predetermined depth.

Referring to FIG. 10K, charge storage layers 164 and tunneling layers 162 may be formed on sides and lower surfaces of the plurality of openings H, using an ALD or CVD process. The charge storage layers 164 and the tunneling layers 162 may be sequentially formed on the plurality of sacrificial layers 130 and interlayer insulating layers 140. Channel areas 173 may be formed on the tunneling layers 162. The channel areas 173 may have a predetermined thickness, for example, 1/50 to 1/5 of thicknesses of the plurality of openings H. The channel areas 173 may be formed by an ALD or CVD process, like the charge storage layers 164 and the tunneling layers 162. Before the charge storage layers 164 and the tunneling layers 162 are formed, epitaxial layers 103 may be formed by performing an SEG process using the second region 115b exposed by the plurality of openings H as a seed layer.

The epitaxial layers 103 may be formed in the plurality of openings H. Crystal facets of exposed portions of the second region 115b on which the epitaxial layers 103 may be formed may be different from each other, and heights of the epitaxial layers 103 formed on the exposed portions of the second region 115b may be different from each other. In an exemplary embodiment, the grain boundaries between the lateral grains included in the second region 115b may not be located below the epitaxial layers 103, and differences in heights of the epitaxial layers 103 may be minimized.

After the charge storage layers 164 and the tunneling layers 162 are formed, the channel areas 173 and embedded insulating layers 175 may be formed. Inner surfaces of the channel areas 173 may be filled with the embedded insulating layers 175. Optionally, a hydrogen annealing process through which structures including the channel areas 173 are heat-treated in a gas atmosphere including hydrogen or deuterium, may be further executed before the embedded insulating layers 175 are formed. By the hydrogen annealing process, a large number of crystal defects existing in the channel areas 173 may be cured.

Although the structures of the channel areas 173 may be formed according to the exemplary embodiment illustrated in FIG. 4, the channel areas 173 may have a different structure. For example, after the plurality of openings H for forming the channel areas 173 are formed, the channel areas 173 may be directly formed without forming the charge storage layers 164, the tunneling layers 162, and the epitaxial layers 103 and forming the embedded insulating layers 175 on the inner surface surfaces of the channel areas 173. The tunneling layers 162 and the charge storage layers 164, like blocking layers 166, may be formed before the gate electrode layers 150 are formed, and disposed on outer sides of the blocking layers 166 to surround the gate electrode layers 150. When the epitaxial layers 103 are not formed, the channel areas 173 may be in direct contact with the second substrate 115.

Next, a planarization process may be performed in order to remove unnecessary semiconductor materials and insulating materials covering the uppermost insulating layer 149. Next, high sections of the embedded insulating layers 175 may be partially removed using, for example, an etching process, and a conductive material for forming drain areas 170 may be disposed on areas in which high sections of the embedded insulating layers 175 have been partially removed. Next, the planarization process may be further executed to form the drain areas 170.

Next, referring to FIG. 10L, division openings CO may be formed to form word-line cuts 107 arranged at predetermined intervals. By the division openings CO, the cell region C may be divided into a plurality of unit cell regions. The division openings CO, similar to the plurality of openings H for forming the channel areas 173, may expose the upper surface of the second region 115b or recess the second region 115b to a predetermined depth.

Referring to FIG. 10M, the plurality of sacrificial layers 130 may be removed to form lateral openings Th. The plurality of lateral openings Th may be formed between the plurality of interlayer insulating layers 140 by selectively removing the plurality of sacrificial layers 130 through the division openings CO while retaining the plurality of insulating layers 140. When the plurality of lateral openings Th are formed, a plurality of gate electrode layers 151 to 158: 150 may be formed by depositing a conductive material in the plurality of lateral openings Th, as illustrated in FIG. 10N.

The blocking layers 166 may be formed in the lateral openings Th together with the gate electrode layers 150. When sequentially forming the blocking layers 166 and the gate electrode layers 150 in the lateral openings Th, the blocking layers 166, similar to the charge storage layers 164 and the tunneling layers 162, may be formed by an ALD, CVD, or a physical vapor deposition (PVD) process. By forming the blocking layers 166 before forming the gate electrode layers 150, the blocking layers 166 may be formed to surround the gate electrode layers 150 as illustrated in FIG. 10I. The gate electrode layers 150 may be formed of a conductive material such as tungsten (W). The gate electrode layers 150, together with the gate insulating layers 160 and the channel areas 173, may configure a plurality of second semiconductor devices.

When the gate electrode layers 150 are formed, source areas 105 may be formed by implanting impurities in portions of the second region 115b exposed by the division openings CO by an ion-implantation process (IIP). The division openings CO disposed on the source areas 105 may be filled with an insulating material to form the word-line cuts 107. As an exemplary embodiment modified from that illustrated in FIG. 10M, a conductive layer extending in the x-axis and y-axis directions may be formed in the word-line cuts 107 to be electrically connected to the source areas 105.

The method of manufacturing the memory device 100 described with reference to FIGS. 10A to 10N may be similarly applied to the memory device 200 illustrated in FIG. 5.

FIGS. 11A to 11K illustrate diagrams of a method of manufacturing the memory device 300 illustrated in FIG. 6. FIGS. 11A to 11K may be cross-sectional views of the perspective view of FIG. 3 in the x-axis direction, according to the process sequence.

Figure 11A:
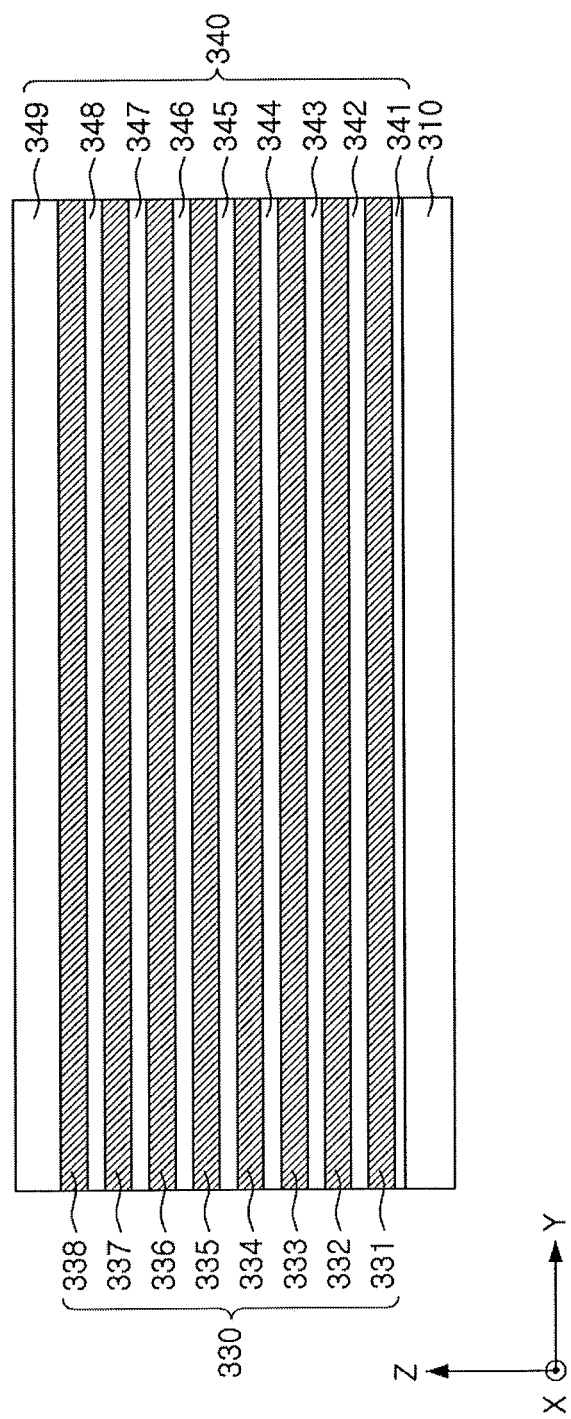
FIGS. 11A to 11K illustrate diagrams of a method of manufacturing the memory device illustrated in FIG. 6.

Referring to FIG. 11A, a first substrate 310 may be provided, and a plurality of insulating layers 341 to 349: 340 and a plurality of sacrificial layers 331 to 338: 330 may be alternatingly stacked on the first substrate 310. The first substrate 310 may include single crystalline silicon. Similar to a method described with reference to FIG. 10I, the plurality of sacrificial layers 330 may be formed of a material having a high etching selectivity with respect to the plurality of insulating layers 340, and may be selectively etched. For example, the plurality of insulating layers 340 may be silicon oxide layers, and the plurality of sacrificial layers 330 may be silicon nitride layers. Thicknesses of the plurality of insulating layers 340 may be different.

Figure 11B:
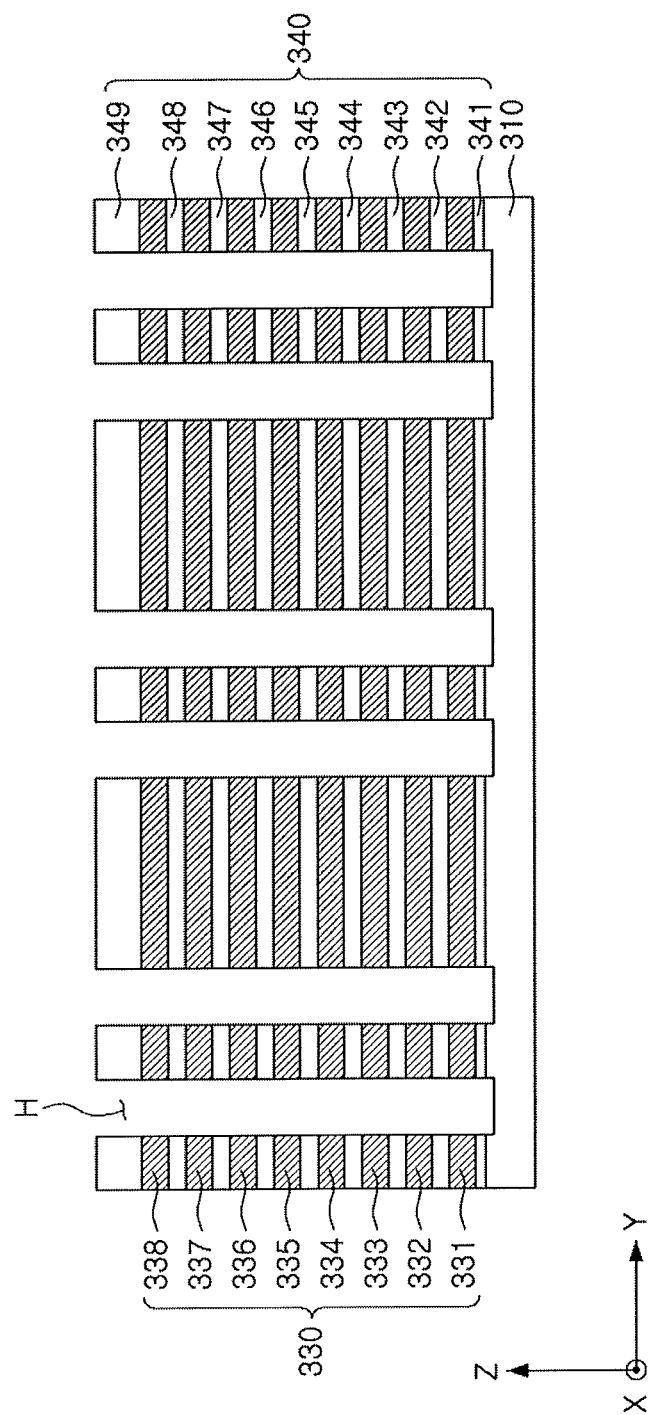

Referring to FIG. 11B, a plurality of openings H for forming channel areas 373 may be formed. The plurality of openings H may pass through the plurality of insulating layers 340 and the plurality of sacrificial layers 330 in the z-axis direction, and expose portions of an upper surface of the first substrate 310 or recess the first substrate 310 to a predetermined depth.

Figure 11C:
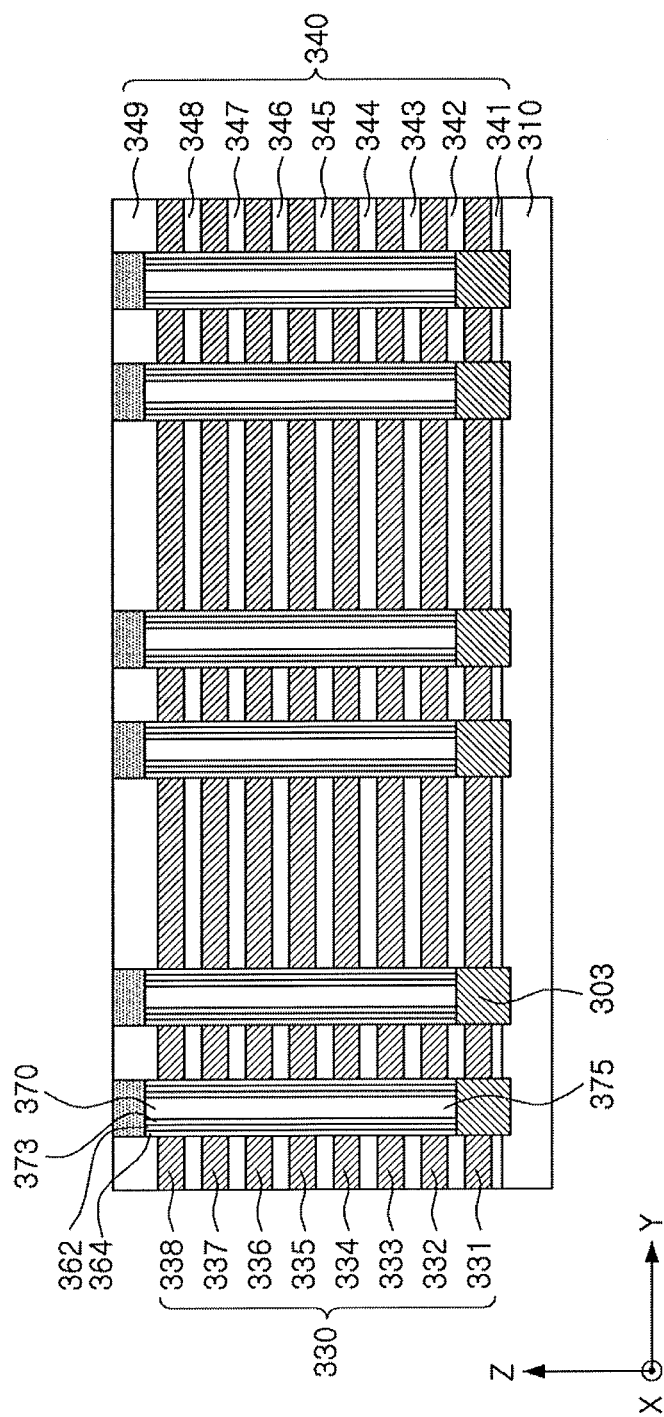

Next, referring FIG. 11C, epitaxial layers 303 may be formed by an SEG process using the portions of the first substrate 310 exposed on bottoms of the plurality of openings H as seed layers, and charge storage layers 364, tunneling layers 362, channel areas 373, and embedded insulating layers 375 may be formed thereon. The charge storage layers 364 and the tunneling layers 362 may be sequentially stacked on the plurality of sacrificial layers 330 and the plurality of insulating layers 340, and the channel areas 373 may be formed on the tunneling layers 362. The charge storage layers 364, the tunneling layers 362, and the channel areas 373 may be formed by ALD or CVD.

Inner surfaces of the channel areas 373 may be filled with embedded insulating layers 375. Optionally, a hydrogen annealing process in which structures including the channel areas 373 are heat-treated in a gas atmosphere including hydrogen or deuterium, may be further executed before the embedded insulating layers 375 are formed. By the hydrogen annealing process, a large number of crystal defects existing in the channel areas 173 may be cured.

Figure 11D:
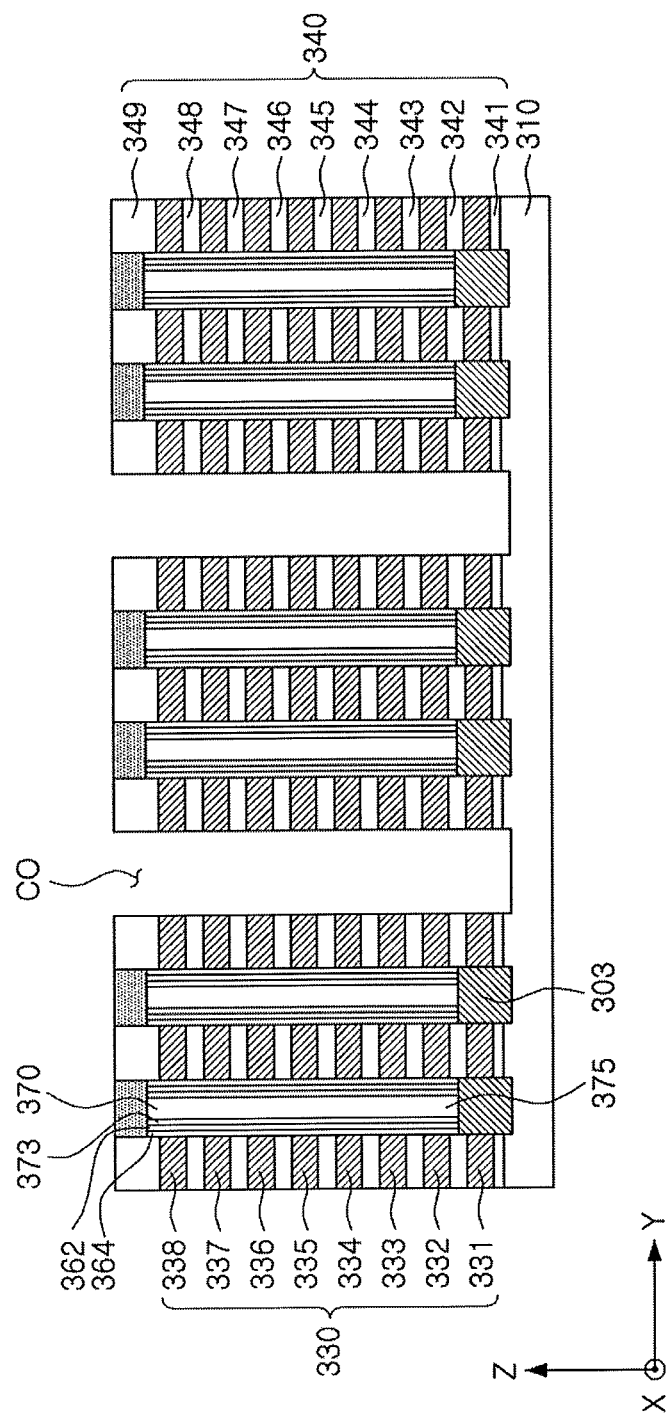

Next, referring to FIG. 11D, division openings CO for forming word-line cuts 307 may be formed at predetermined intervals. By the division openings CO, the cell region C may be divided into a plurality of unit cell regions. The division openings CO, similar to the plurality of openings H for forming the channel areas 373, may expose the upper surface of first substrate 310 or recess the first substrate 310 to a predetermined depth.

Figure 11E:
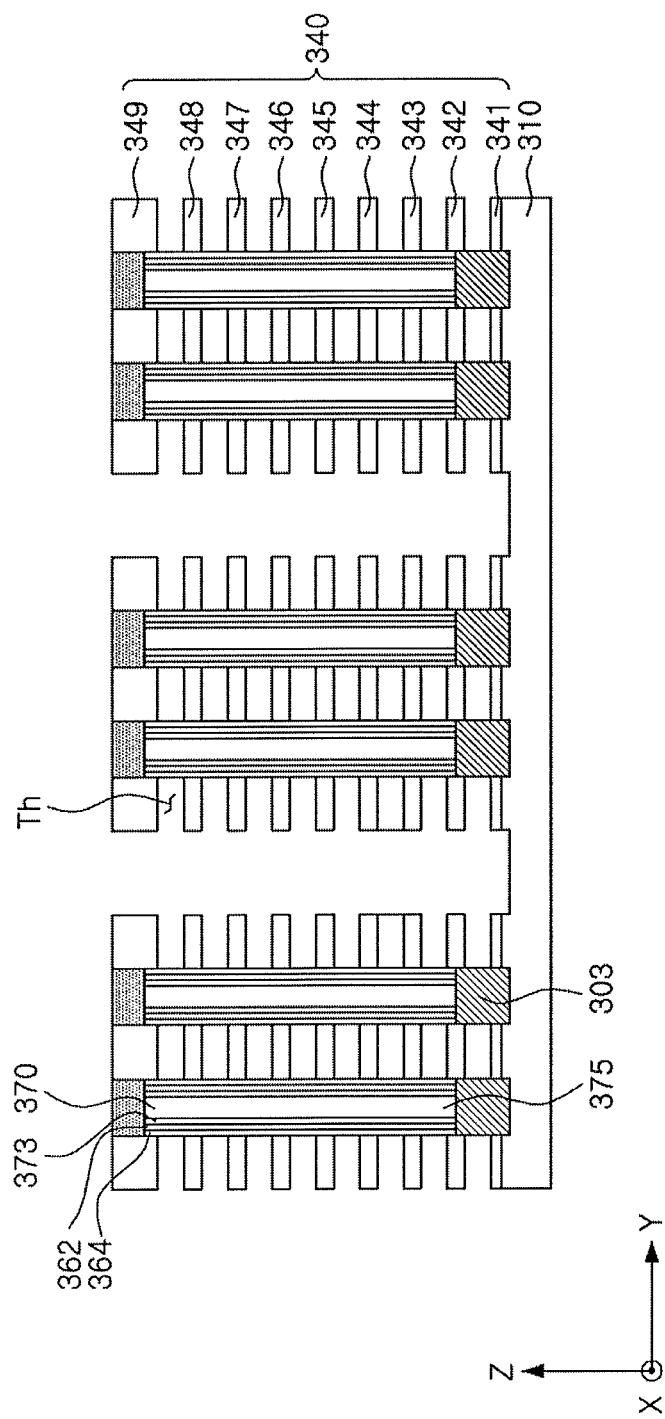
Figure 11F:
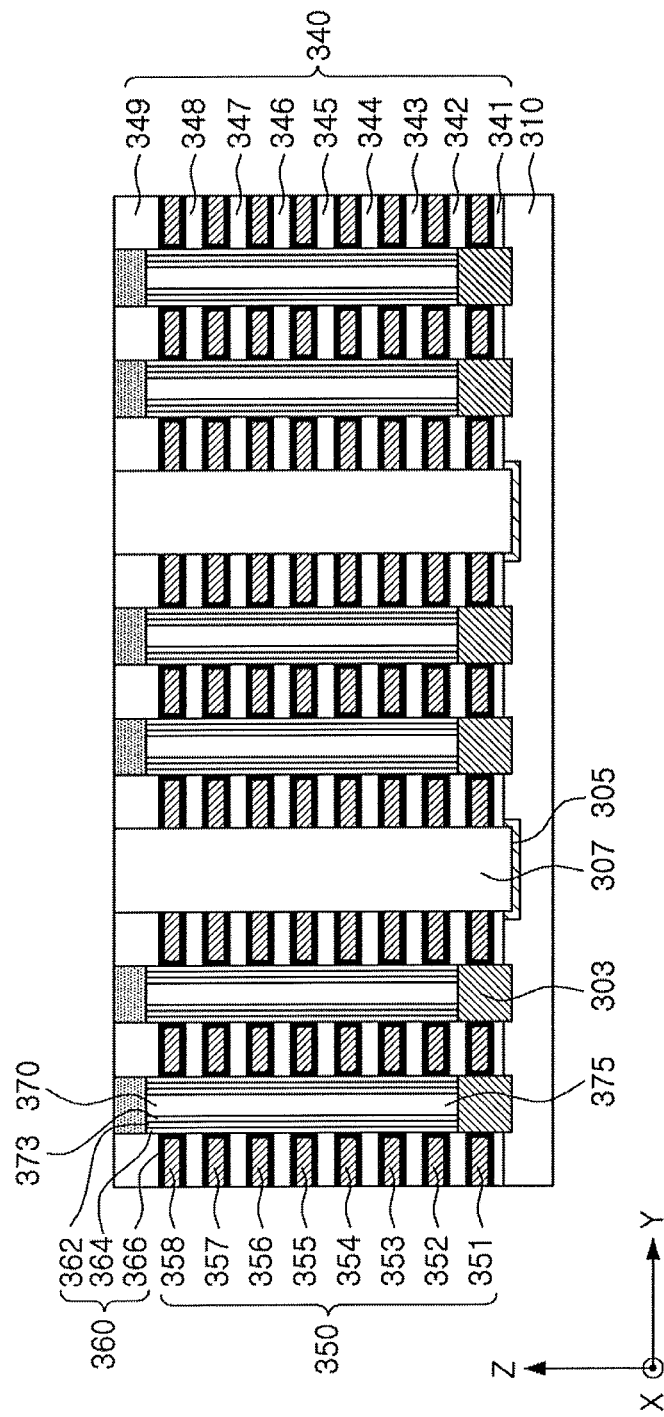
Figure 11G:
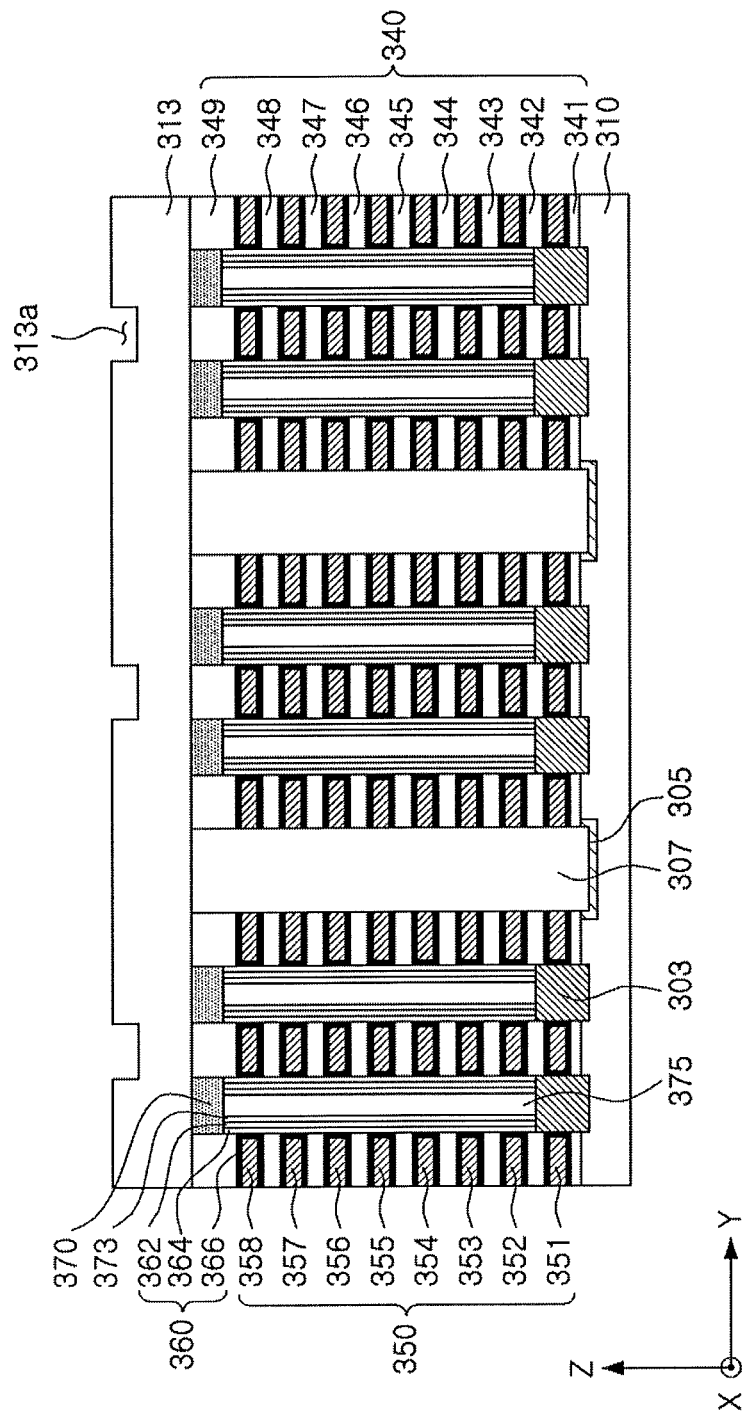

Referring to FIG. 11E, lateral openings Th may be formed by removing the plurality of sacrificial layers 330. The plurality of lateral openings Th may be formed between the plurality of insulating layers 340 by selectively removing the plurality of sacrificial layers 330 through the division openings CO while retaining the plurality of insulating layers 340. When the plurality of lateral openings Th are formed, blocking layers 366 and a plurality of gate electrode layers 350 (including layers 351 to 358) may be formed in the plurality of lateral openings Th, as illustrated in FIG. 11F. The plurality of gate electrode layers 350 may include a conductive material such as W, and the blocking layers 366 may be formed by an ALD, CVD, or PVD process, similar to the charge storage layers 364 and the tunneling layers 362.

When the gate electrode layers 350 are formed, source areas 305 may be formed by implanting impurities in the portions of the first substrate 110 exposed by the division openings CO, using an ion-implantation process. The division openings CO disposed on the source areas 305 may be filled with an insulating material to form the word-line cuts 307. A conductive layer extending in the x-axis and y-axis directions may be formed in the word-line cuts 307 and electrically connected to the source areas 305. The plurality of gate electrode layers 350, together with the channel areas 373 and the gate insulating layer 360, may provide a plurality of first semiconductor devices.

When a first memory region provided as the cell region C is formed as illustrated in FIG. 11F, a first interlayer insulating layer 313 may be formed on the uppermost insulating layer 349, and a plurality of grooves 313a may be formed in the first interlayer insulating layer 313. The plurality of grooves 313a may be formed by forming a mask exposing only the portions corresponding to the plurality of grooves 313a on the first interlayer insulating layer 313 and performing an etching process.

Figure 11H:
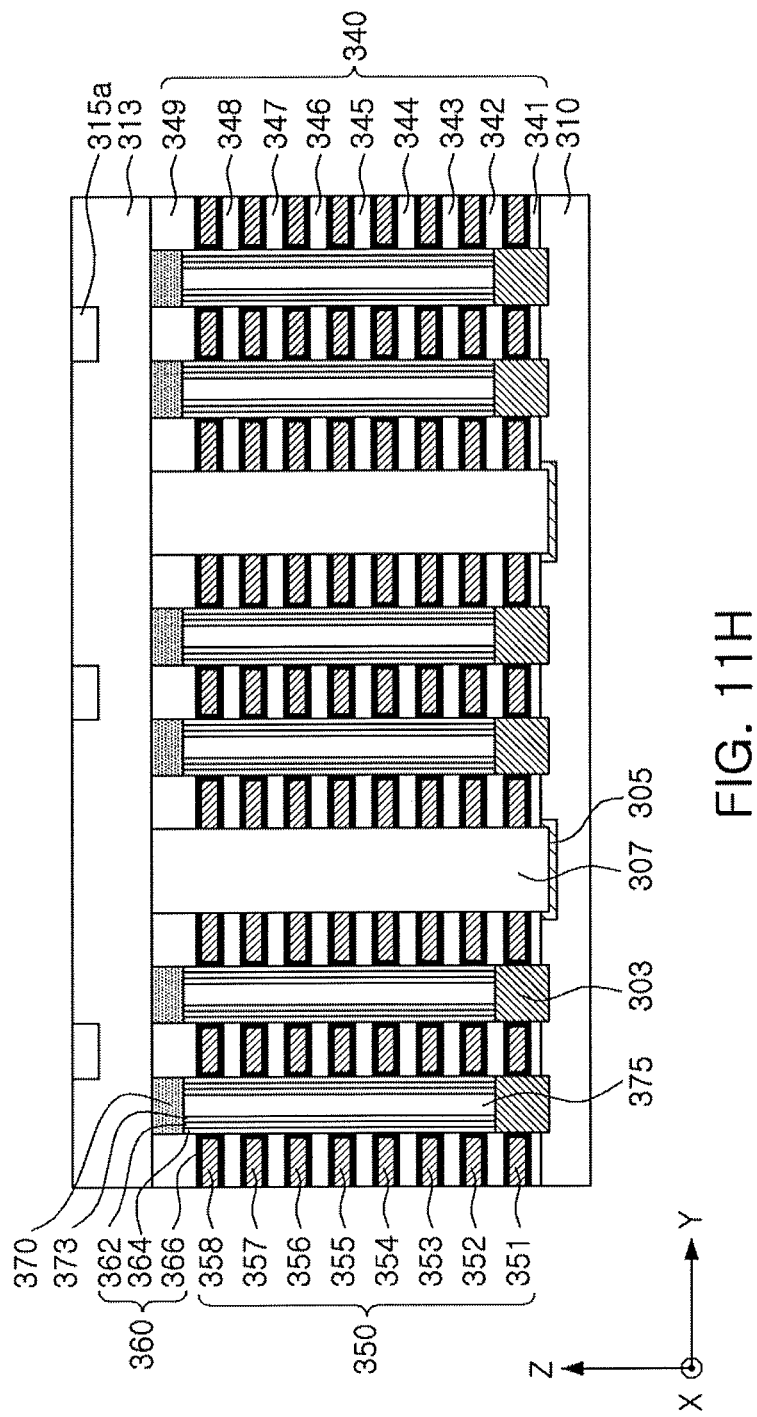
Figure 11I:
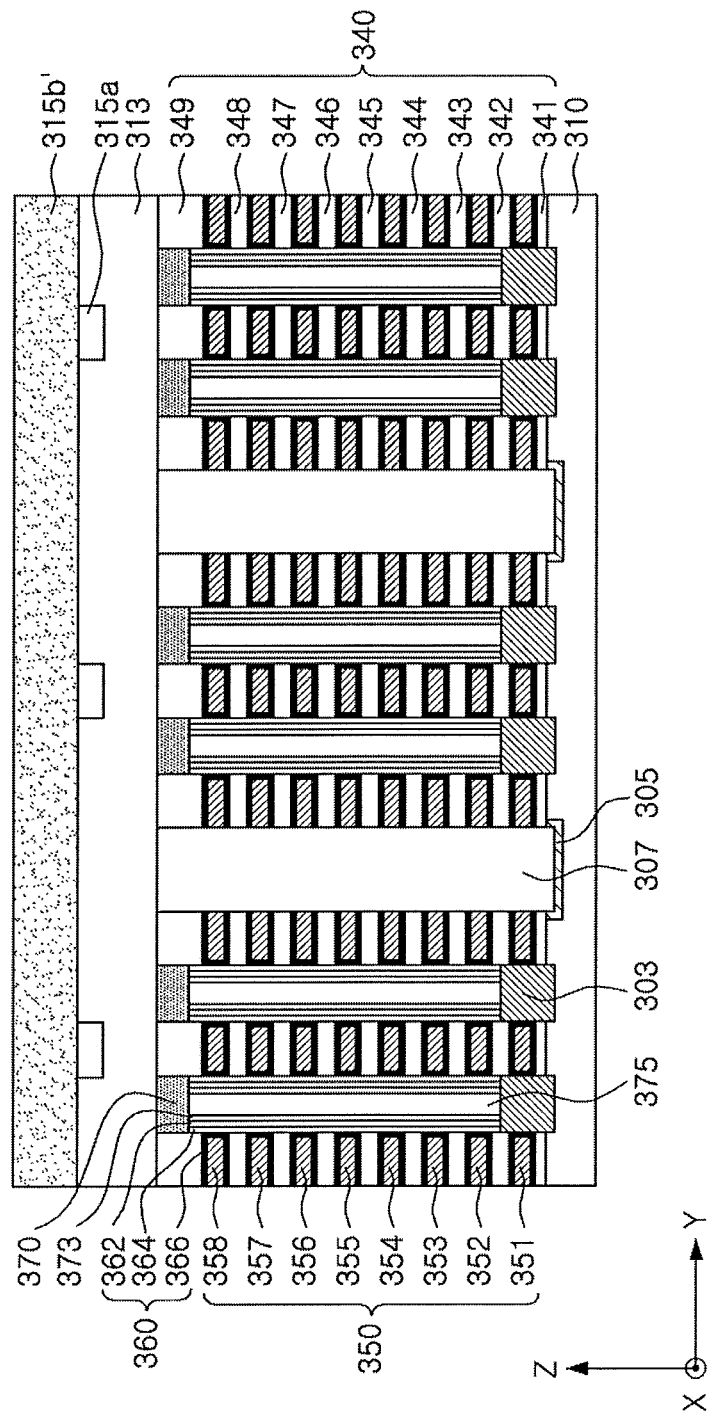
Figure 11J:
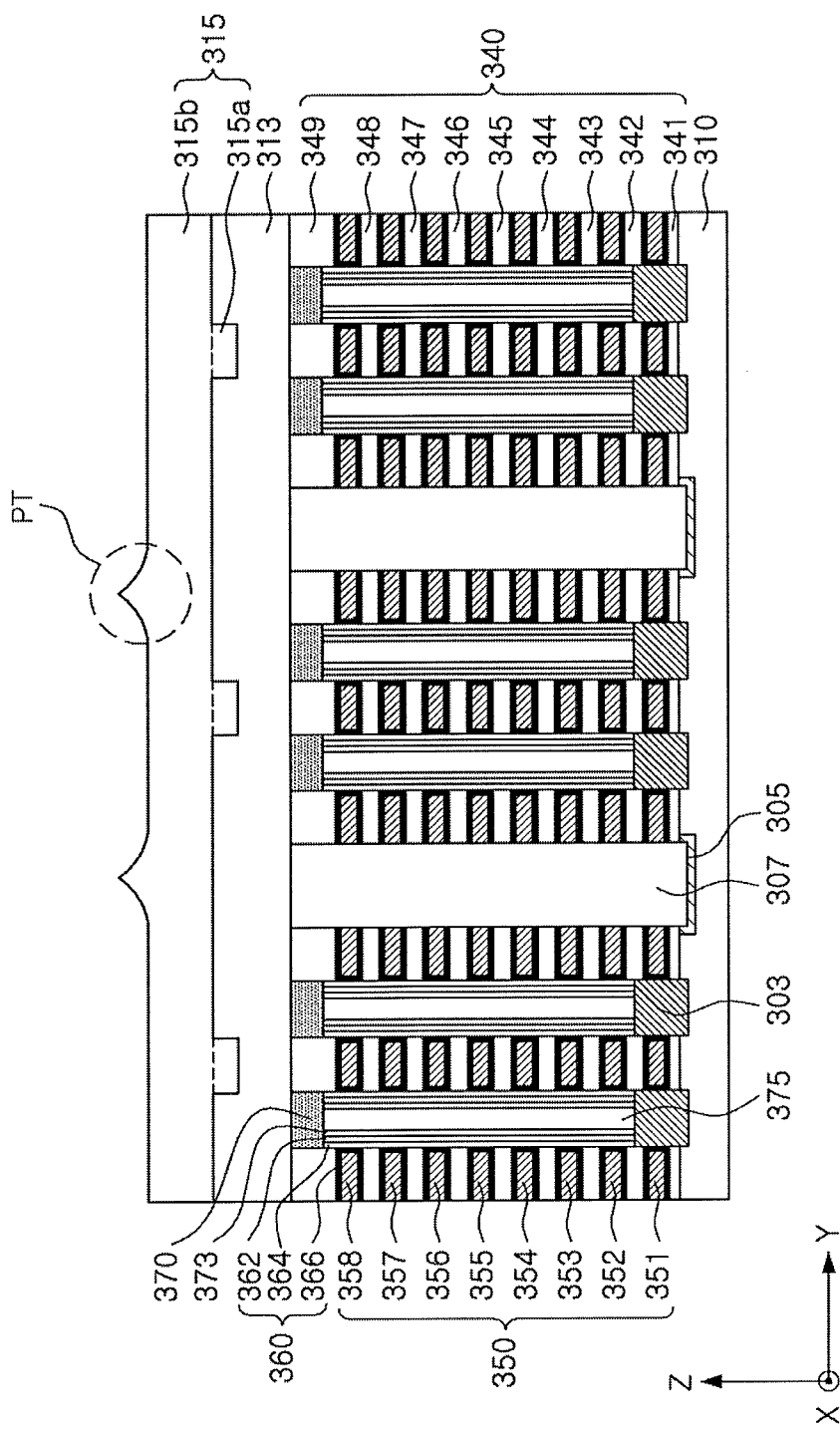

Referring to FIG. 11H, first regions 315a for forming the second substrate 315 may be formed in the plurality of grooves 313a. The first regions 315a may include polysilicon, and may be formed by filling the plurality of grooves 313a with amorphous silicon and laser-annealing the amorphous silicon. When the first regions 315a are formed, an amorphous silicon layer 315b' may be formed on the first regions 315a and the first interlayer insulating layer 313, as illustrated in FIG. 11I.

When the amorphous silicon layer 315b' is formed, a second region 315b of the second substrate 315 may be formed by melting the amorphous silicon layer 315b' using a laser-annealing process and crystallizing the melted amorphous silicon layer 315b'. The melted amorphous silicon layer 315b' may be crystallized by an SLS process. At least a portion of grains generated during the crystallization process of the amorphous silicon layer 315b' may be lateral grains extending in the y-axis direction and may extend from the grains included in the first regions 315a. The second region 315b may have protrusions PT protruding upwardly between the first regions 315a due to, for example, the grain boundaries formed between the lateral grains, and the protrusions PT may be removed by a polishing process such as CMP.

Figure 11K:
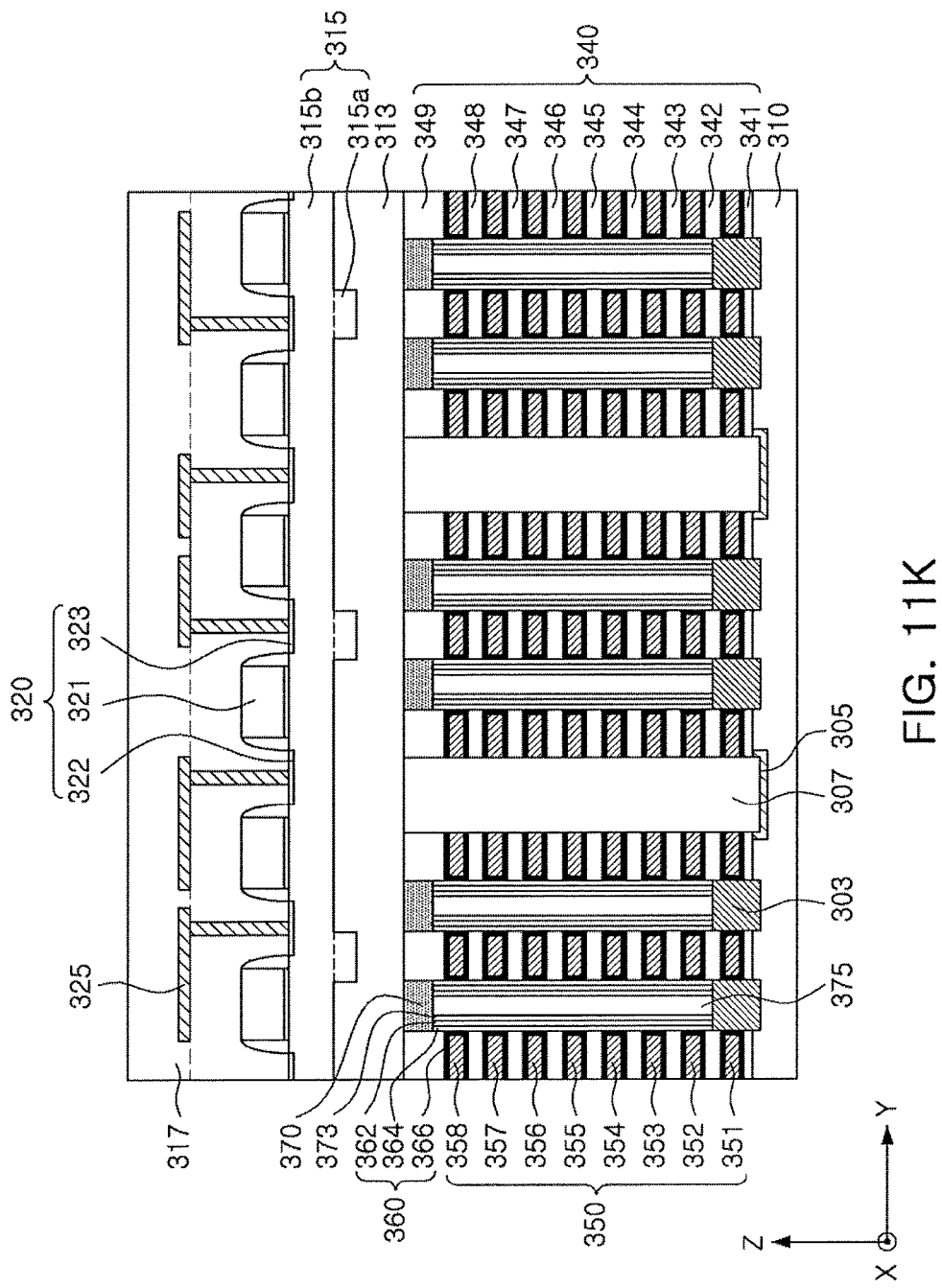

When the second substrate 315 is formed, a plurality of second semiconductor devices 320, gate spacers 324, metal lines 325, and a second interlayer insulating layer 317 may be formed on the second substrate 315, as illustrated in FIG. 11K. The plurality of second semiconductor devices 320 may be horizontal transistors including gate electrodes 321, source electrodes 322, and drain electrodes 323, and may be provided as circuit devices transmitting a predetermined signal to the plurality of first semiconductor devices. The memory device 300 fabricated according to the exemplary embodiments described with reference to FIGS. 11A to 11K may have a structure in which the peripheral circuit region P is disposed on the cell region C.

FIGS. 12A to 12F illustrate diagrams of a method of manufacturing the memory device 400 illustrated in FIG. 6.

Figure 12A:
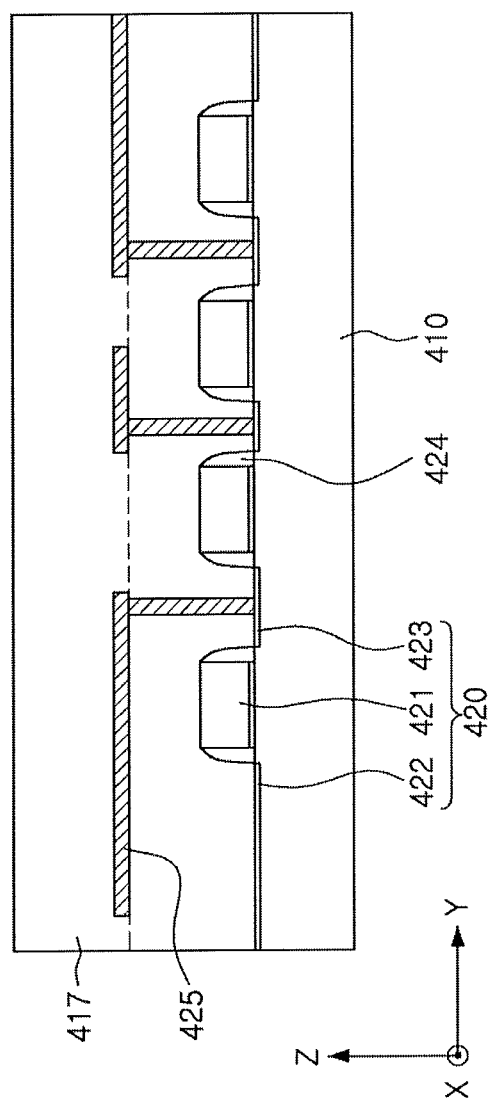
FIGS. 12A to 12G illustrate diagrams of a method of manufacturing the memory device illustrated in FIG. 7.

Referring to FIG. 12A, a first memory region including a first substrate 410, a plurality of first semiconductor devices 420 formed on the first substrate 410, and a first interlayer insulating layer 417 covering the plurality of first semiconductor devices 420 may be provided. The first memory region may be provided as a peripheral circuit region P. The plurality of first semiconductor devices 420 may be horizontal transistors, and may include gate electrodes 421, source electrodes 422, and drain electrodes 423. Gate spacers 424 may be formed on outer sides of the gate electrodes 421, and the plurality of first semiconductor devices 420 may be connected to at least one metal line 425. The metal line 425 may be embedded in the first interlayer insulating layer 417.

Figure 12B:
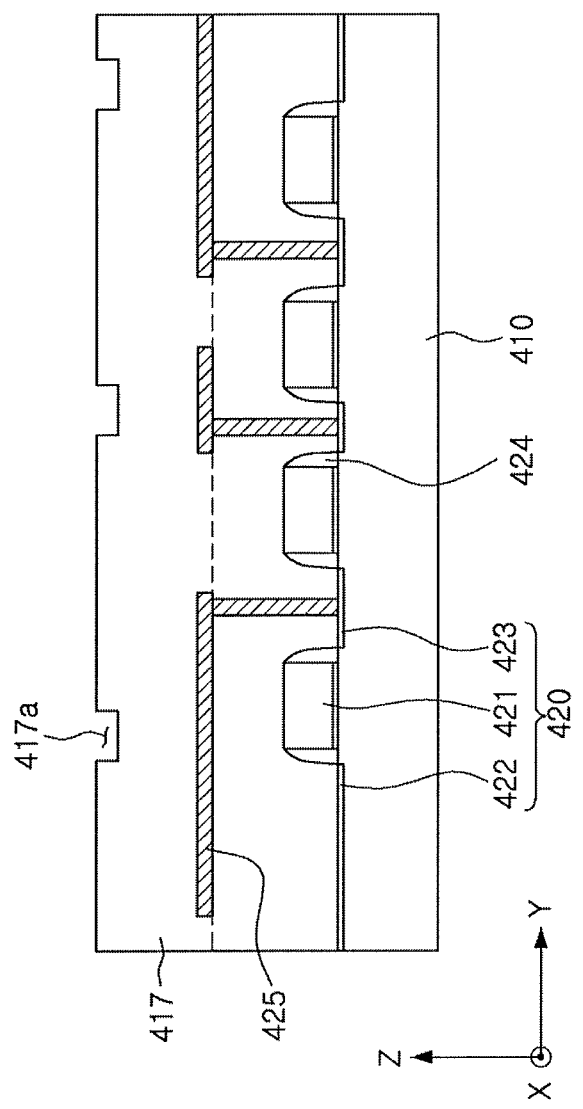
Figure 12C:
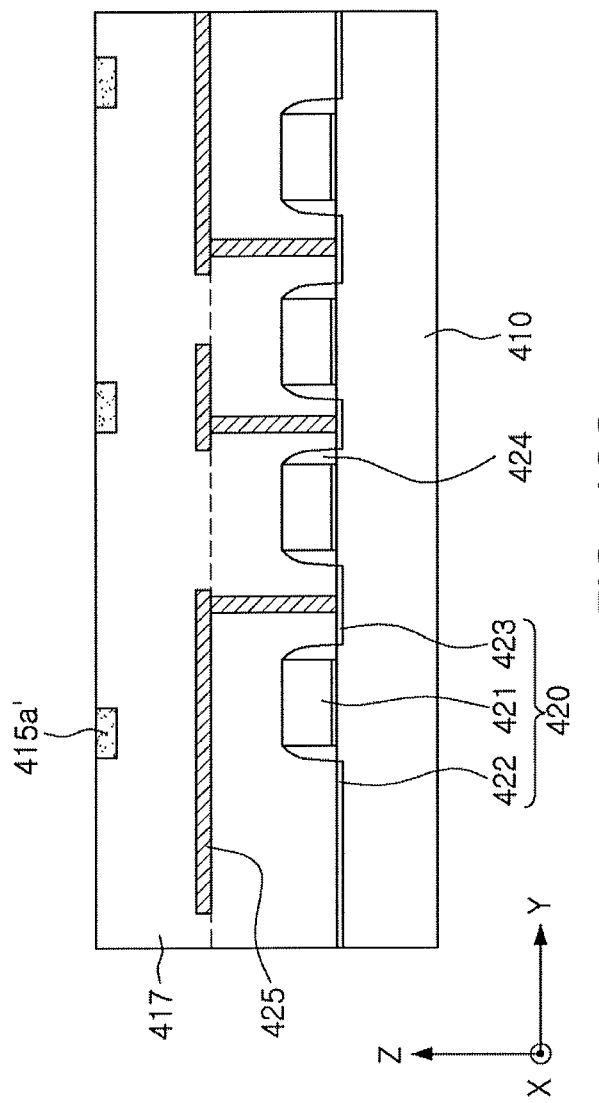
Figure 12D:
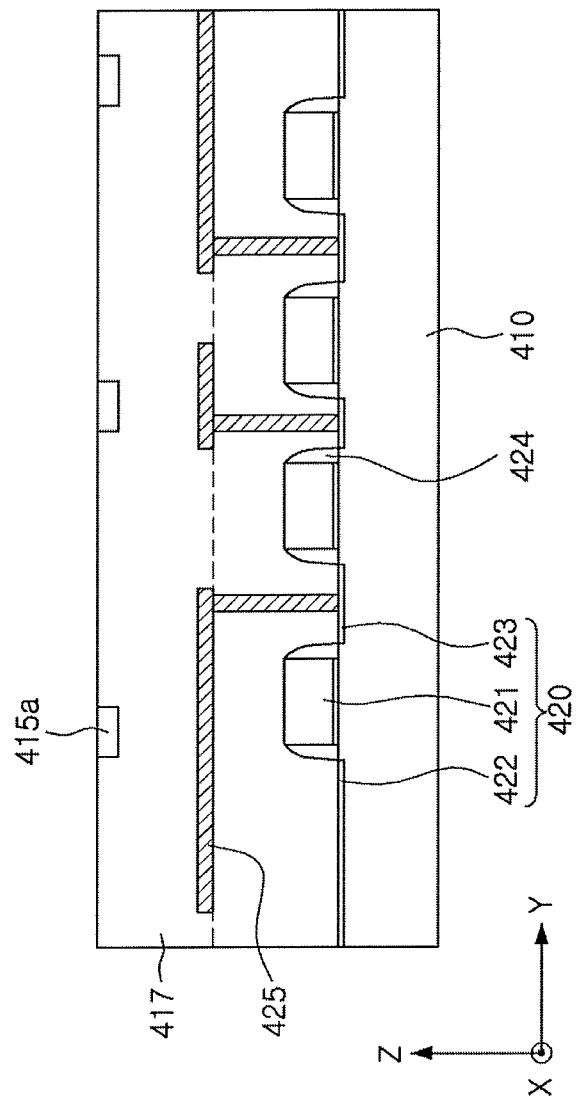

Referring to FIG. 12B, a plurality of grooves 417a may be formed in the first interlayer insulating layer 417. The plurality of grooves 417a may extend in the first direction (an x-axis direction in FIG. 12B), and may be formed by forming a mask layer exposing only the portions corresponding to the plurality of grooves 417a on the first interlayer insulating layer 417 and performing an etching process. When the plurality of grooves 417a are formed, the plurality of grooves 417a may be filled with amorphous silicon 415a', as illustrated in FIG. 12C. By performing a laser-annealing process on the amorphous silicon 415a', first regions 415a for forming the second substrate 415 may be formed (please refer to FIG. 12D).

Figure 12E:
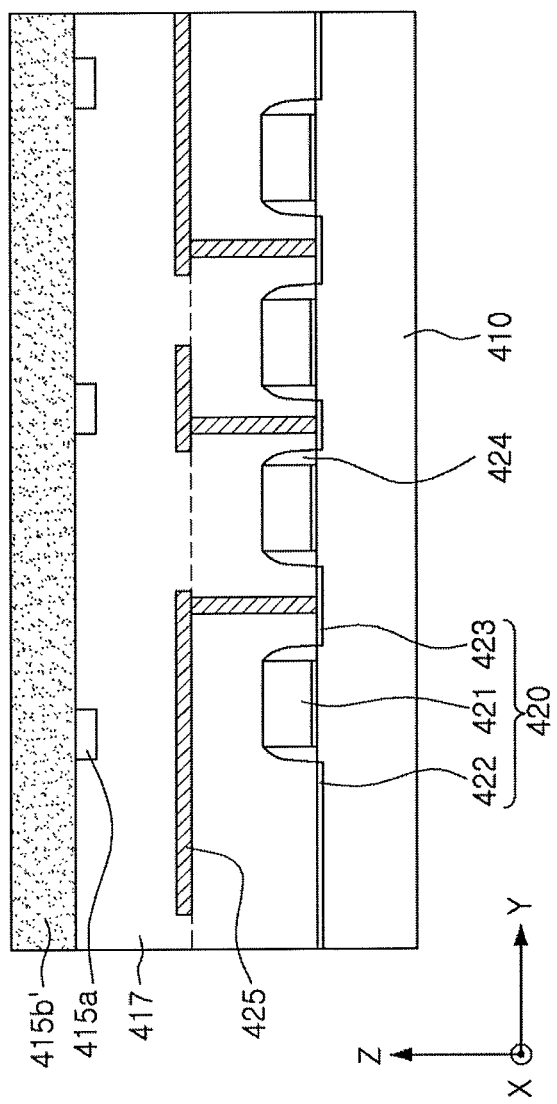
Figure 12F:
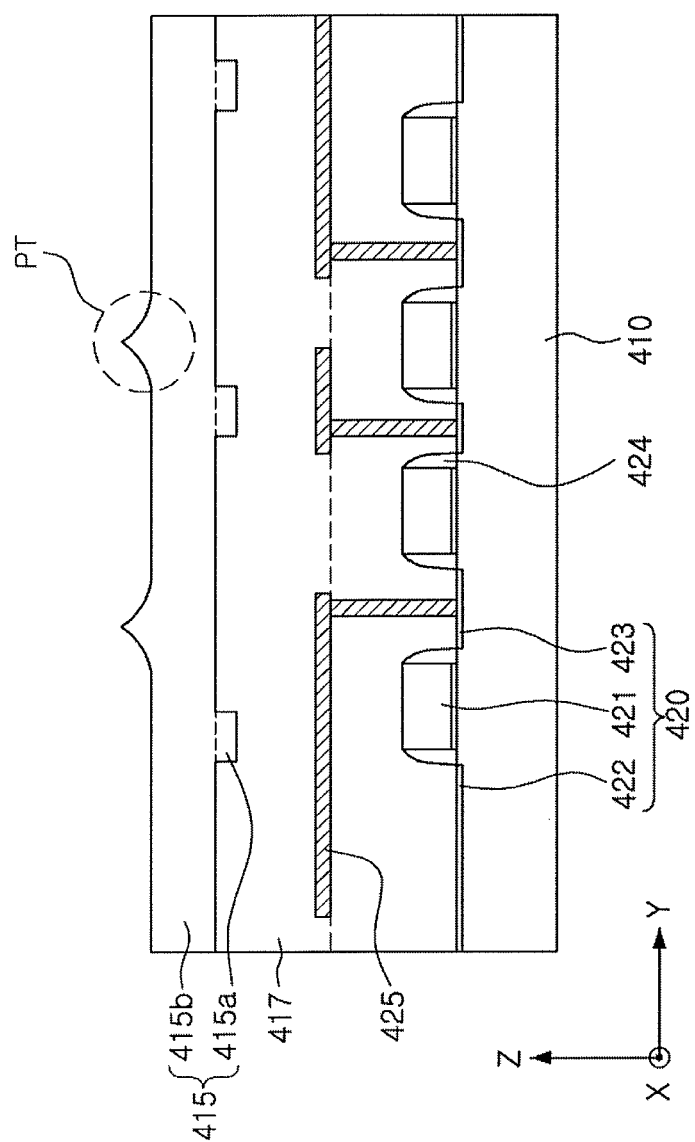
Figure 12G:
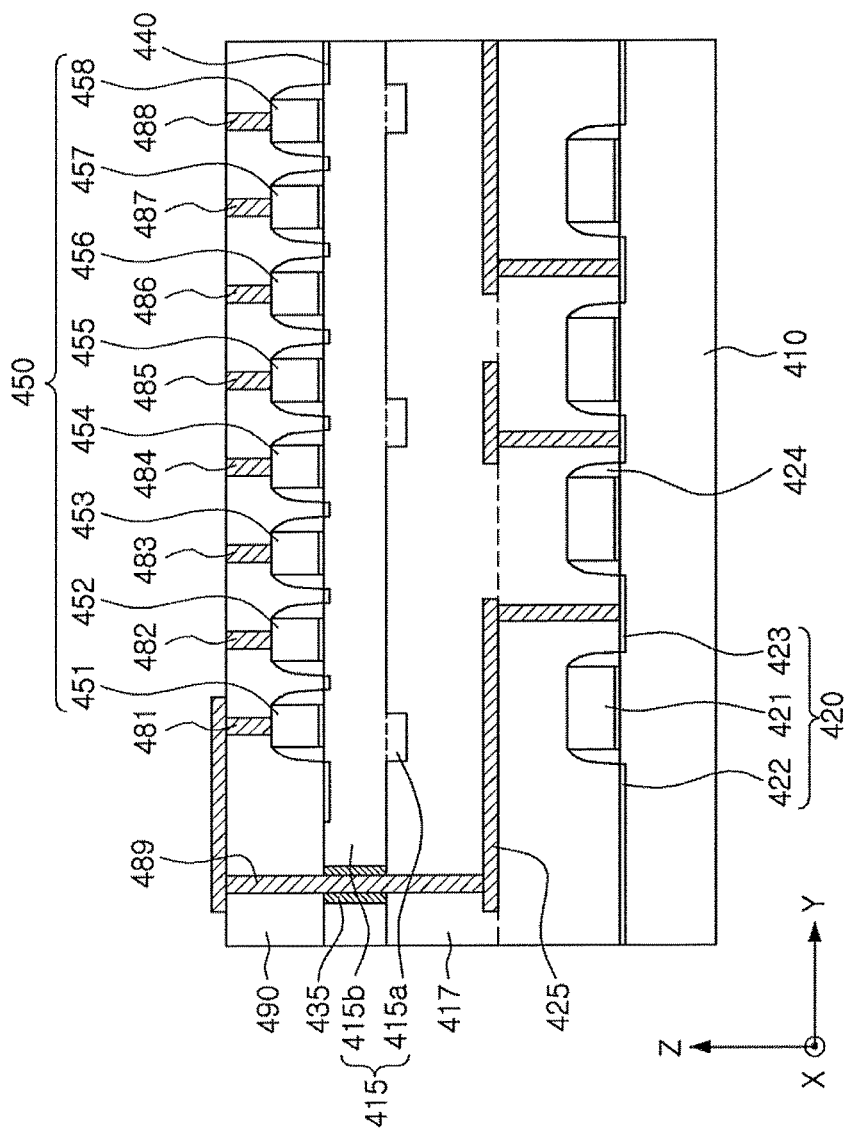

Next, referring to FIG. 12E, an amorphous silicon layer 415b' may be deposited on the first regions 415a and the first interlayer insulating layer 417. The amorphous silicon layer 415b' may be melted by, for example, a laser-annealing process, and the melted amorphous silicon layer 415b' may be crystallized to form the second substrate 415, as illustrated in FIG. 12F. The second region 415b may be formed using the first regions 415a as seed layers, and at least a portion of grains included in the second region 415b may be extended from the first regions 415a. The grains included in the second region 415b may be lateral grains extending in a lateral direction (in the y-axis direction), and protrusions PT may be formed at portions of the second region 415b in which the grain boundaries are disposed between the lateral grains included in the second region 415b. The protrusions PT may be removed in a polishing process.

When an upper surface of the second region 415b is planarized by removing the protrusions PT, a plurality of second semiconductor devices including a plurality of gate electrode layers 451 to 458: 450, a plurality of contact plugs 481 to 489, and a cell interlayer insulating layer 490 may be formed on the second region 415b to form a second memory region. The plurality of second semiconductor devices including the plurality of gate electrode layers 450 may provide memory cell transistors, and at least a portion of the plurality of gate electrode layers 450 may be connected to at least a portion of the plurality of first semiconductor devices 420 via the contact plug 489. The contact plug 489 connecting the portion of the plurality of first semiconductor devices 420 to the portion of the plurality of gate electrode layers 450 may pass through a cell interlayer insulating layer 430 included in the cell region C, the second substrate 415, and the first interlayer insulating layer 417 included in the peripheral circuit region P. In order to electrically isolate the second substrate 415 from the contact plug 489, a contact insulating layer 435 may be formed between the second substrate 415 and the contact plug 489.

Figure 13:
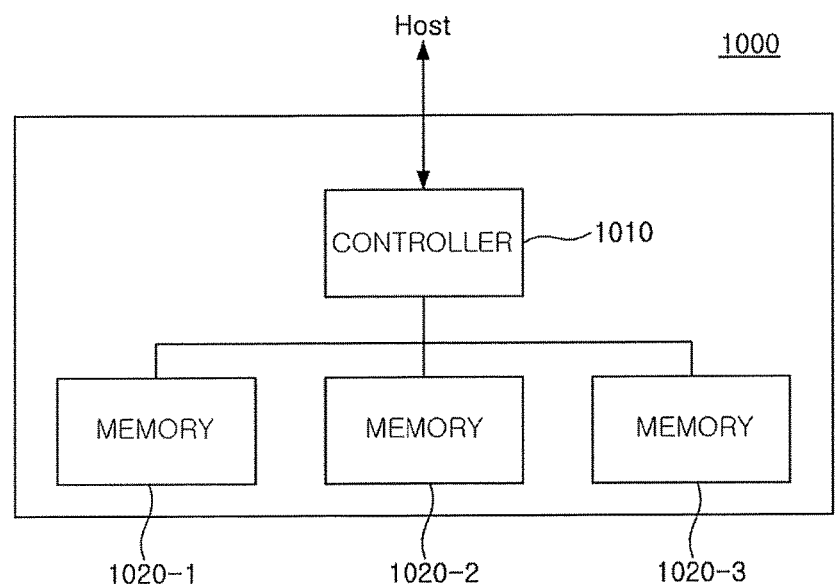
FIGS. 13 and 14 illustrate diagrams provided to illustrate operations of a process management system according to exemplary embodiments.

FIG. 13 illustrates a block diagram of a storage apparatus including a memory device according to an exemplary embodiment.

Referring to FIG. 13, a storage apparatus 1000 according to an exemplary embodiment may include a controller 1010 communicating with a host HOST, and memories 1020-1, 1020-2, and 1020-3 storing data. Each of the memories 1020-1, 1020-2, and 1020-3 may include a memory device 100, 200, 300, or 400 according to the above-described various exemplary embodiments.

The host HOST communicating with the controller 1010 may be a variety of electronic apparatuses in which the storage apparatus 1000 is installed, for example, a smartphone, a digital camera, a desktop PC, a laptop computer, or a media player. The controller 1010 may receive a request for data reading or writing from the host HOST to generate a command CMD for writing data to the memories 1020-1, 1020-2, and 1020-3 or reading data from the memories 1020-1, 1020-2, and 1020-3.

As illustrated in FIG. 13, one or more memories 1020-1, 1020-2, and 1020-3 may be connected to the controller 1010 in parallel in the storage apparatus 1000. By connecting the plurality of memories 1020-1, 1020-2, and 1020-3 to the controller 1010 in parallel, the storage apparatus 1000 having a large amount of capacity, such as a solid state drive (SSD) may be implemented.

Figure 14:
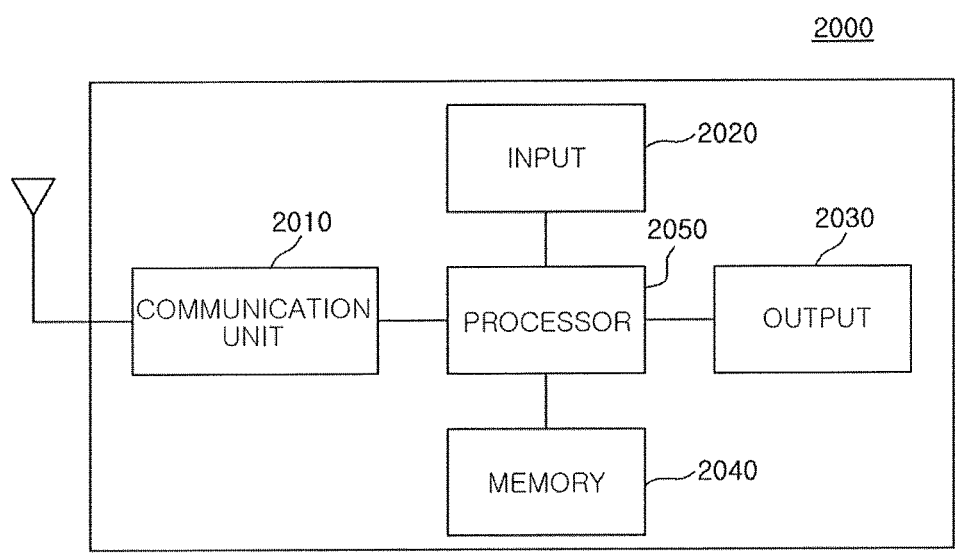

FIG. 14 illustrates a block diagram of an electronic apparatus including a memory device according to an exemplary embodiment.

Referring to FIG. 14, an electronic apparatus 2000 according to an exemplary embodiment may include a communication unit 2010, an input 2020, an output 2030, a memory 2040, and a processor 2050.

The communication unit 2010 may include a wired/wireless communications module, such as a wireless internet module, a short-range communications module, a GPS module, or a mobile communications module. The wired/wireless communications module included in the communication unit 2010 may be connected to an external communications network by a variety of communications standards to transmit and receive data.

The input 2020 may be a module supplied for a user to control an operation of the electronic apparatus 2000, and may include, for example, a mechanical switch, a touchscreen, or a voice recognition module. The input 2020 may include a trackball, a laser pointer mouse, or a finger mouse, and further include a variety of sensor modules in which a user may input data.

The output 2030 may output information processed by the electronic apparatus 2000 in an audio or video form. The memory 2040 may store a program for processing or controlling of, for example, the processor 2050 or data. The memory 2040 may include a memory device 100, 200, 300, or 400 according to the above-described various exemplary embodiments. The processor 2050 may write data or read data by transmitting a command to the memory 2040 according to a required operation.

The memory 2040 may be embedded in the electronic apparatus 2000 or may communicate with the processor 2050 via a separate interface. When the memory 2040 communicates with the processor 2050 via the separate interface, the processor 2050 may write data to or read data from the memory 2040 using a variety of interface standards, such as SD, SDHC, SDXC, MICRO SD, or USB.

The processor 2050 may control operations of each unit included in the electronic apparatus 2000. The processor 2050 may perform controlling or processing operations related to voice calls, video calls, or data communication, or controlling or processing operations for multimedia playback and management. The processor 2050 may process an input transmitted via the input 2020 from a user, and output a result thereof via the output 2030. Further, the processor 2050 may write data required to control operations of the electronic apparatus 2000 to the memory 2040, or read data from the memory 2040, as described above.

By way of summation and review, in a memory device having a COP or POC structure, separate substrates for forming a cell region and a peripheral circuit region may be required since the cell region and the peripheral circuit region may be arranged in vertically different regions. In a COP structure, a substrate for forming the cell region disposed at a relatively upper portion may need to be disposed on an interlayer dielectric (ILD) layer of a peripheral circuit region, a single crystalline silicon substrate may not be used, and a polysilicon substrate may be used as the substrate for forming the cell region. The polysilicon substrate may include crystals having different orientations, and characteristics of a SEG layer and memory cell devices, included in the cell region, may be degraded.

According to embodiments, a substrate for forming a region disposed at a relatively upper portion in a COP or POC structure may be formed using an ELA process or an SLS process. For example, in the COP structure, a plurality of groove patterns may be formed on an ILD layer of the peripheral circuit region, and a first region including polysilicon may be formed in the groove patterns. A second region may be formed by depositing an amorphous silicon layer on the first region, melting the amorphous silicon layer using, for example, an ELA process, and crystallizing the melted amorphous silicon layer using the first region as a seed layer. The second region may include lateral grains, sizes of the lateral grains may be greater than sizes of normal polysilicon grains, and a substrate having excellent crystallinity may be formed on the ILD layer of the peripheral circuit region.

As a method of increasing the degree of integration of semiconductor devices, memory devices may have a structure in which a region including memory cell transistors and a region including devices for driving the memory cell transistors may be arranged vertically, as different regions.

Embodiments may provide a memory device including a cell region and a peripheral region arranged vertically, as different regions, and improving characteristics of a substrate for forming a memory device, disposed in a relatively high position, of the cell region and the peripheral region.

As set forth above, according to exemplary embodiments, a memory device may include a cell region and a peripheral circuit region, arranged vertically, as different regions, to increase a degree of integration thereof. The performance of the memory device may be improved by improving characteristics of a substrate for forming an upper region.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a memory device, the method comprising:
   providing a first memory region including a first substrate, a plurality of first semiconductor devices on the first substrate, and a first interlayer insulating layer covering the plurality of first semiconductor devices;
   forming a plurality of grooves by removing a portion of an upper surface of the first interlayer insulating layer;

forming a plurality of first regions including polysilicon in the plurality of grooves;

planarizing upper surfaces of the plurality of first regions such that an upper surface of the polysilicon in the plurality of grooves and the upper surface of the first interlayer insulating layer are coplanar;

forming a first amorphous silicon layer on the plurality of first regions;

forming a second region including polysilicon formed by crystallizing the first amorphous silicon layer on the plurality of first regions; and providing a second memory region by forming a plurality of second semiconductor devices on the second region.

2. The method as claimed in claim 1, wherein forming the plurality of first regions includes:

filling the plurality of grooves with second amorphous silicon; and laser-annealing the second amorphous silicon.

3. The method as claimed in claim 1, wherein forming the second region includes:

melting the first amorphous silicon layer; and crystallizing the melted first amorphous silicon layer using the plurality of first regions as seed layers.

4. The method as claimed in claim 3, wherein forming the second region includes crystallizing the melted first amorphous silicon layer using a sequential lateral solidification process.

5. The method as claimed in claim 3, wherein forming the second region includes planarizing an upper surface of the second region.

6. The method as claimed in claim 1, wherein providing the second memory region includes:

forming a channel area extending in a direction perpendicular to an upper surface of the second region;

forming a plurality of gate electrode layers stacked on the second region, the plurality of gate electrode layers being adjacent to the channel area; and forming at least one word-line cut extending in the direction perpendicular to the upper surface of the second region, the at least one word-line cut being between the plurality of first regions, the at least one word-line cut dividing the plurality of gate electrode layers into a plurality of unit blocks.

7. The method as claimed in claim 1, wherein each of the plurality of first regions extends in a horizontal direction to overlap the plurality of first semiconductor devices on the first substrate in a vertical direction.

8. A method of manufacturing a device, the device including a first layer on a second layer, the method comprising:

forming grooves on an interlayer dielectric layer of the second layer;

forming first regions including polysilicon in the grooves;

planarizing upper surfaces of the first regions such that an upper surface of the polysilicon in the grooves and an upper surface of the interlayer dielectric layer are coplanar;

forming a second region by depositing an amorphous silicon layer on the first regions;

melting the amorphous silicon layer to form a melted amorphous silicon layer; and crystallizing the melted amorphous silicon layer using the first regions as a seed layer, the second region including lateral grains crystallized from the first regions and grain boundaries being between the lateral grains in the second region and being between the first regions.

9. The method of claim 8, wherein a protrusion is formed between the first regions due to the grain boundaries between the first regions, the method further comprising:

removing the protrusion using a polishing process; and planarizing an upper surface of the second region.

10. The method of claim 9, further comprising forming a plurality of second semiconductor devices on the second region, forming the plurality of second semiconductor devices on the second region including forming a word-line cut between the first regions.

11. The method of claim 10, wherein forming the word-line cut between the first regions includes forming the word-line cut on the grain boundaries between the first regions.

12. The method of claim 11, wherein:

forming the word-line cut on the grain boundaries between the first regions includes forming multiple word-line cuts on respective grain boundaries between the first regions; and the first regions are between every pair of adjacent word-line cuts.

* * * * *